United States Patent
Ji et al.

(10) Patent No.: US 12,538,846 B2
(45) Date of Patent: Jan. 27, 2026

(54) LIGHT-EMITTING PANEL AND DISPLAY APPARATUS SWITCHABLE BETWEEN WIDE AND NARROW VIEWING ANGLES

(71) Applicant: Shanghai Tianma Micro-electronics Co., Ltd., Shanghai (CN)

(72) Inventors: Shengchao Ji, Shanghai (CN); Qiang Dong, Shanghai (CN); Xiaoping Sun, Shanghai (CN); Lihua Wang, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 447 days.

(21) Appl. No.: 18/115,862

(22) Filed: Mar. 1, 2023

(65) Prior Publication Data
US 2024/0178198 A1    May 30, 2024

(30) Foreign Application Priority Data
Nov. 29, 2022    (CN) .......................... 202211534568.2

(51) Int. Cl.
| | |
|---|---|
| *H01L 25/075* | (2006.01) |
| *G09G 3/32* | (2016.01) |
| *H10H 20/855* | (2025.01) |
| *H10H 20/857* | (2025.01) |

(52) U.S. Cl.
CPC .......... *H01L 25/0753* (2013.01); *G09G 3/32* (2013.01); *H10H 20/855* (2025.01); *H10H 20/857* (2025.01); *G09G 2310/0267* (2013.01); *G09G 2310/061* (2013.01)

(58) Field of Classification Search
CPC .. G09G 3/32; G09G 2310/0267; H10H 29/10; H10H 29/142; H10H 20/857

USPC ............................................................ 257/79
See application file for complete search history.

(56) References Cited

U.S. PATENT DOCUMENTS

| | | | | |
|---|---|---|---|---|
| 2018/0209616 | A1* | 7/2018 | Lee ........................ | F21V 29/70 |
| 2019/0056613 | A1* | 2/2019 | Wang ...................... | G02F 1/163 |
| 2021/0367126 | A1* | 11/2021 | Hong .................... | H10H 20/858 |
| 2022/0352132 | A1* | 11/2022 | Seo ....................... | H10D 86/021 |

FOREIGN PATENT DOCUMENTS

| | | |
|---|---|---|
| CN | 108897169 A | 11/2018 |

\* cited by examiner

*Primary Examiner* — Eliseo Ramos Feliciano
*Assistant Examiner* — Mikka Liu
(74) *Attorney, Agent, or Firm* — Anova Law Group, PLLC

(57) ABSTRACT

A light-emitting panel and a display apparatus are provided in the present disclosure. The light-emitting panel includes light-emitting units, where the light-emitting unit includes a pixel circuit and a light-emitting element which are electrically connected to each other, the light-emitting element includes light-emitting parts, and a plurality of light-emitting parts in one light-emitting element includes first and second light-emitting parts; and a substrate, where a collimation structure is on a side of the first light-emitting part away from the substrate, and an orthographic projection of the collimation structure on the substrate is overlapped with an orthographic projection of the first light-emitting part on the substrate. In the first light-emitting mode, the pixel circuit only controls the first light-emitting part of the light-emitting element to emit light; and in the second light-emitting mode, the pixel circuit at least controls the second light-emitting part of the light-emitting element to emit light.

19 Claims, 21 Drawing Sheets

LIGHT-EMITTING PANEL AND DISPLAY APPARATUS SWITCHABLE BETWEEN WIDE AND NARROW VIEWING ANGLES

CROSS-REFERENCE TO RELATED APPLICATION

The present application claims the priority of Chinese Patent Application No. 202211534568.2, filed on Nov. 29, 2022, the content of which is incorporated herein by reference in its entirety.

TECHNICAL FIELD

The present disclosure generally relates to the field of light-emitting display technology and, more particularly, relates to a light-emitting panel and a display apparatus.

BACKGROUND

With the development of display technology, display apparatuses have become indispensable daily necessities, such as mobile phones, notebook computers, personal digital assistants and the like. The viewing angle of the display gradually widens with the development of display technology. While enjoying visual experience of large viewing angle, people also hope to effectively protect commercial secrets and personal privacy and avoid commercial loss or embarrassment caused by the leakage of screen information. Therefore, in addition to the requirement for wide viewing angle, people may also require that the display apparatuses have a function of switching between wide viewing angle and narrow viewing angle in various scenarios.

Currently, following manners may be configured to implement switching between wide viewing angle and narrow viewing angle of the display apparatus.

Attaching an anti-peep film on the display screen may achieve the switching. When anti-peep function is required, the anti-peep film may be configured to cover the screen for reducing the viewing angle. However, such manner may require an additional anti-peep film, which causes great inconvenience to a user. In addition, one anti-peep film may only achieve one viewing angle. Once the anti-peep film is attached, the viewing angle may be fixed. Only narrow viewing angle mode may be realized, and wide viewing angle function may no longer be displayed, that is, the switching between wide and narrow viewing angles may not be realized.

Double liquid crystal cells may be configured in the liquid crystal display apparatus to adjust the viewing angle of the liquid crystal display apparatus. The double liquid crystal cells may include a top liquid crystal layer and a bottom liquid crystal layer which are vertically aligned. By controlling the voltage applied to the double liquid crystal cells, the switching between wide and narrow viewing angles may be realized. However, since two liquid crystal layers need to be arranged on the apparatus, the cost, thickness and power consumption of the liquid crystal display apparatus may increase, which may not meet the development trend of thin and light liquid crystal display apparatus.

Existing anti-peep display may need to be disposed with an anti-peep functional layer, so the design of multi-layer structure may easily lead to a complex and heavy structure of the display apparatus and require higher fabrication process requirement. Moreover, most of existing technologies capable of switching between wide and narrow viewing angles are applicable to liquid crystal displays (LCDs), but not applicable to self-light-emitting display apparatuses, such as micro LEDs (light-emitting diodes) and mini LEDs.

Therefore, there is a need to provide a light-emitting panel and a display apparatus with simple structure and reduced cost and power consumption, which may realize free switching between wide viewing angle and narrow viewing angle and may also be applicable to the field of self-light-emitting display technology.

SUMMARY

One aspect of the present disclosure provides a light-emitting panel. The light-emitting panel includes a plurality of light-emitting units, where a light-emitting unit of the plurality of light-emitting units includes a pixel circuit and a light-emitting element which are electrically connected to each other; the light-emitting element includes a plurality of light-emitting parts; and a plurality of light-emitting parts in one light-emitting element includes a first light-emitting part and a second light-emitting part; and a substrate, where the pixel circuit and the light-emitting element are disposed on the substrate; a collimation structure is on a side of the first light-emitting part away from the substrate; and an orthographic projection of the collimation structure on the substrate is overlapped with an orthographic projection of the first light-emitting part on the substrate. The light-emitting panel includes a first light-emitting mode and a second light-emitting mode; in the first light-emitting mode, the pixel circuit only controls the first light-emitting part of the light-emitting element electrically connected to the pixel circuit to emit light; and in the second light-emitting mode, the pixel circuit at least controls the second light-emitting part of the light-emitting element electrically connected the pixel circuit to emit light.

Another aspect of the present disclosure provides a display apparatus including a light-emitting panel. The light-emitting panel includes a plurality of light-emitting units, where a light-emitting unit of the plurality of light-emitting units includes a pixel circuit and a light-emitting element which are electrically connected to each other; the light-emitting element includes a plurality of light-emitting parts; and a plurality of light-emitting parts in one light-emitting element includes a first light-emitting part and a second light-emitting part; and a substrate, where the pixel circuit and the light-emitting element are disposed on the substrate; a collimation structure is on a side of the first light-emitting part away from the substrate; and an orthographic projection of the collimation structure on the substrate is overlapped with an orthographic projection of the first light-emitting part on the substrate. The light-emitting panel includes a first light-emitting mode and a second light-emitting mode; in the first light-emitting mode, the pixel circuit only controls the first light-emitting part of the light-emitting element electrically connected to the pixel circuit to emit light; and in the second light-emitting mode, the pixel circuit at least controls the second light-emitting part of the light-emitting element electrically connected the pixel circuit to emit light.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to describe the principles of the present disclosure.

DETAILED DESCRIPTION

Figure 1:
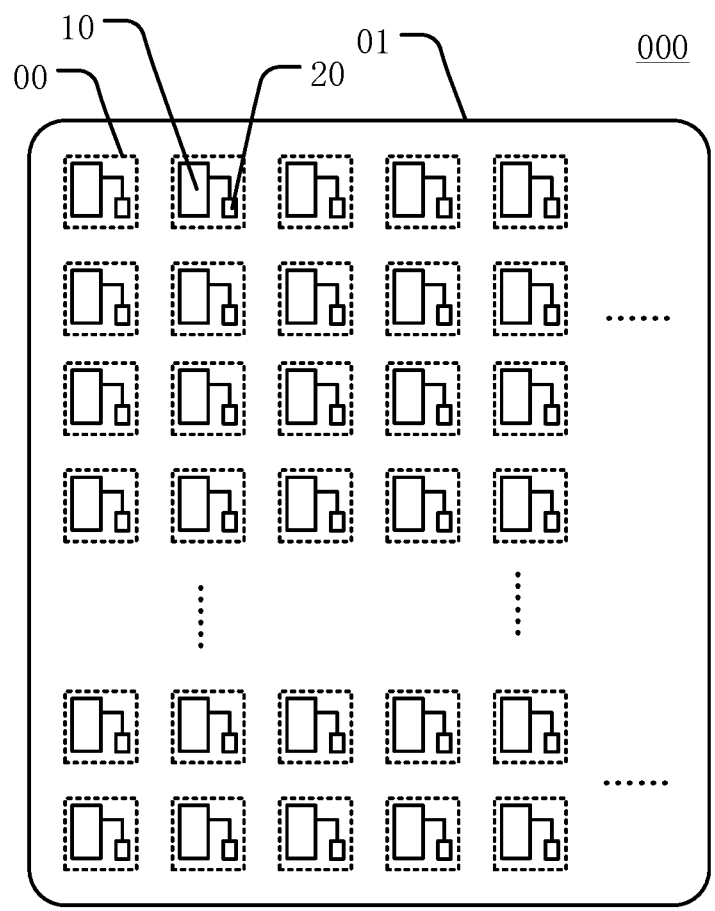
FIG. 1 illustrates a planar structural schematic of a light-emitting panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be regarded as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters are configured to indicate similar items in following drawings. Therefore, once an item is defined in one drawing, it does not need to be further discussed in subsequent drawings.

Figure 2:
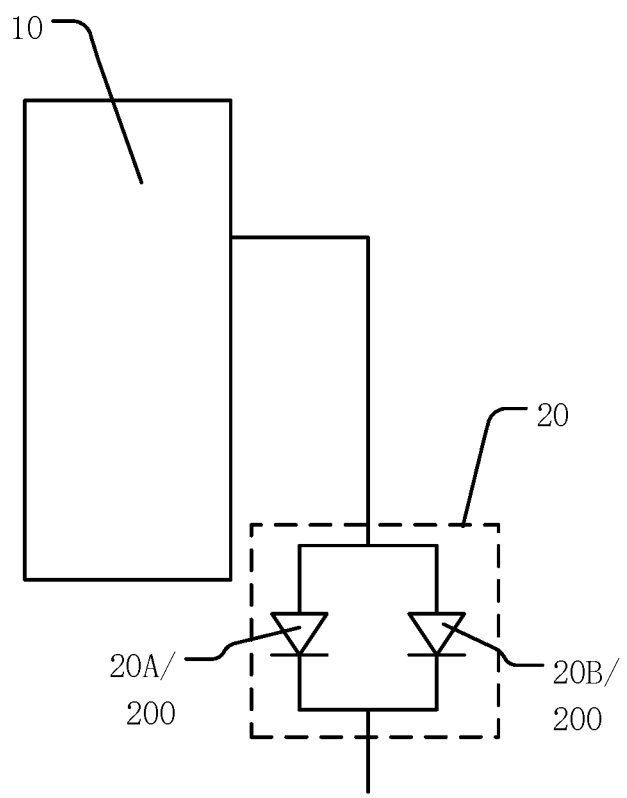
FIG. 2 illustrates an electrical connection structural schematic of a light-emitting unit in FIG. 1.
Figure 3:
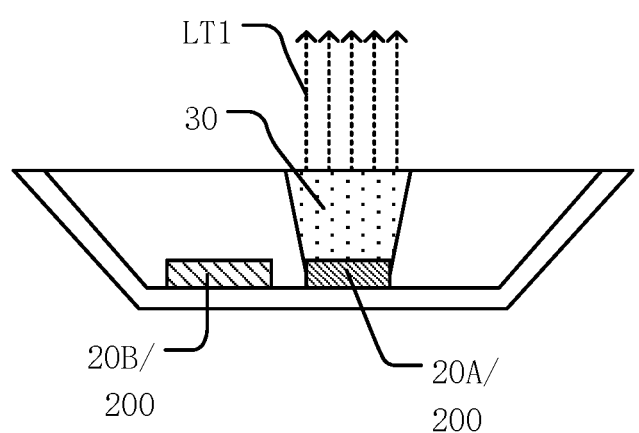
FIG. 3 illustrates a cross-sectional structural view of a light-emitting element according to various embodiments of the present disclosure.

Referring to FIGS. 1-3, FIG. 1 illustrates a planar structural schematic of a light-emitting panel according to various embodiments of the present disclosure; FIG. 2 illustrates an electrical connection structural schematic of a light-emitting unit in FIG. 1; and FIG. 3 illustrates a cross-sectional structural view of a light-emitting element according to various embodiments of the present disclosure. A light-emitting panel 000 provided in one embodiment may include a plurality of light-emitting units 00, where the light-emitting unit 00 may include a pixel circuit 10 and a light-emitting element 20 which are electrically connected to each other.

The light-emitting element 20 may include a plurality of light-emitting parts 200, and the plurality of light-emitting parts 200 in one light-emitting element 20 may include a first light-emitting part 20A and a second light-emitting part 20B.

The light-emitting panel 000 may further include a substrate 01, where the pixel circuit 10 and the light-emitting element 20 may be disposed on the substrate 01.

The side of the first light-emitting part 20A away from the substrate 01 may include a collimation structure 30. The orthographic projection of the collimation structure 30 on the substrate 01 may be overlapped with the orthographic projection of the first light-emitting part 20A on the substrate 01.

The light-emitting panel 000 may include a first light-emitting mode and a second light-emitting mode.

In the first light-emitting mode, the pixel circuit 10 may only control the first light-emitting part 20A of the light-emitting element 20 electrically connected to the pixel circuit 10 to emit light.

In the second light-emitting mode, the pixel circuit 10 may at least control the second light-emitting part 20B of the light-emitting element 20 electrically connected the pixel circuit 10 to emit light.

For example, the light-emitting panel 000 provided in one embodiment may be a light-emitting panel made of sub-millimeter light-emitting diodes (mini LED) or micro-light-emitting diodes (micro LED). The light-emitting panel 000 may include the plurality of light-emitting units 00; and the light-emitting units 00 may be understood as a plurality of light-emitting pixel regions by dividing the light-emitting panel 000. It may be understood that, in one embodiment, the array arrangement of the plurality of light-emitting units 00 may be used as an example for illustration in FIG. 1. During an implementation, the arrangement of the plurality of light-emitting units 00 in the light-emitting panel 000 may include, but may not be limited to, such array arrangement. In one embodiment, the light-emitting panel 000 may include the substrate 01; and the pixel circuit 10 and the light-emitting element 20 may be disposed on the substrate 01. The substrate 01 may be used as a carrier substrate of the light-emitting panel 000 for fabricating and disposing other structures of the light-emitting panel 000 on the substrate 01. Each light-emitting unit 00 may include the pixel circuit 10 and the light-emitting element 20 which are electrically connected to each other, where the pixel circuit 10 may be a drive circuit that provides a drive current for the light-emitting element 20, and the light-emitting element 20 may emit light under the drive of the pixel circuit 10. Optionally, the light-emitting element 20 in one embodiment may be any one of light-emitting chips including sub-millimeter light-emitting diodes or micro-light-emitting diodes. The micro-light-emitting chip may be transferred and bonded to the substrate 01 of the light-emitting panel 000 by mass transfer technology. In one embodiment, the transfer process of each light-emitting element 20 may not be described in detail, which may refer to the manufacturing process of light-emitting panels made of sub-millimeter light-emitting diodes or micro-light-emitting diodes in existing technology. The light-emitting panel 000 in one embodiment realizes image display by integrating an array of high-density micro-sized light-emitting elements 20 on the substrate 01 as display pixels. Optionally, each display pixel may be individually driven to emit light through the drive control of the pixel circuit 10. The light-emitting panel 000 in one embodiment may reduce the distance between pixels from the millimeter level to the micron level, and may be a self-light-emitting display, which has the advantages of better material stability, longer life, and no burn-in image. Optionally, the light-emitting panel 000 provided in one embodiment may be directly used as a display panel, which may be beneficial for improving display uniformity and display resolution. Or the light-emitting panel 000 provided in one embodiment may also be used as a backlight of a liquid crystal display panel, thereby being beneficial for improving the light-emitting uniformity of the light-emitting panel, providing uniform backlight for the liquid crystal display panel, and improving the display effect. The usage of the light-emitting panel 000 may not be limited in one embodiment, which may be selected and configured according to actual needs during an implementation.

The light-emitting element 20 in one embodiment may include the plurality of light-emitting parts 200. That is, one light-emitting element 20 may include the plurality of independent light-emitting parts 200 inside the light-emitting element 20, where the plurality of light-emitting parts 200 in one light-emitting element 20 may include the first light-emitting part 20A and the second light-emitting part 20B. Optionally, in one embodiment, one light-emitting element 20 including the first light-emitting part 20A and the second light-emitting part 20B is taken as an example for illustration in drawings. During an implementation, the quantity of light-emitting parts 200 included in one light-emitting element 20 may include, but may not be limited to, above-mentioned quantity. One light-emitting element 20 may also include one first light-emitting part 20A and two or more second light-emitting parts 20B, which may not be limited in one embodiment herein. One light-emitting element 20 in one embodiment may be electrically connected to the pixel circuit 10, such that the plurality of light-emitting parts 200 (including the first light-emitting part 20A and the second light-emitting part 20B) in one light-emitting element 20 may be all electrically connected to the pixel circuit 10, and the pixel circuit 10 may control whether different light-emitting parts 200 in the light-emitting element 20 to emit light or not. Both the light-emitting element 20 and the pixel circuit 10 in one embodiment may be fabricated on the substrate 01, and the side of the first light-emitting part 20A away from the substrate 01 may include the collimation structure 30. The orthographic projection of the collimation structure 30 on the substrate 01 may be overlapped with the orthographic projection of the first light-emitting part 20A on the substrate 01. The collimation structure 30 may include a structure such as a lens or the like to collimate and gather the light emitted by the first light-emitting part 20A, such that it ensures that the outgoing light of the first light-emitting part 20A after passing through the collimation structure 30 may be collimated light. It may be understood that the structure of the collimation structure 30 may not be limited in one embodiment and may only need to be capable of changing the direction of the outgoing light of the first light-emitting part 20A to achieve collimated light. The collimated light in one embodiment refers to the light perpendicular to the light-emitting surface of the light-emitting panel 000, such as the collimated light LT1 shown in FIG. 2.

The light-emitting panel 000 in one embodiment may include the first light-emitting mode and the second light-emitting mode. Each light-emitting unit 00 may include the pixel circuit 10 and the light-emitting element 20 which are electrically connected to each other, and one light-emitting element 20 may include the plurality of light-emitting parts 200. In the first light-emitting mode of the light-emitting panel 000, the pixel circuit 10 may only control the first light-emitting part 20A of the light-emitting element 20 electrically connected to the pixel circuit 10 to emit light. That is, in the light-emitting unit 00 at this point, the pixel circuit 10 electrically connected to the light-emitting element 20 may only drive and control the first light-emitting part 20A of the light-emitting element 20 to emit light. The side of the first light-emitting part 20A away from the substrate 01 may be disposed with the collimation structure 30. Therefore, after the light emitted by the first light-emitting part 20A passes through the collimation structure 30, the light finally emitted from the light-emitting surface of the light-emitting panel 000 may be the collimated light, that is, the light-emitting range of a narrow viewing angle, thereby realizing the first light-emitting mode of the light-emitting panel 000 with narrow viewing angle.

In the second light-emitting mode of the light-emitting panel 000, the pixel circuit 10 may at least control the second light-emitting part 20B of the light-emitting element 20 electrically connected to the pixel circuit 10 to emit light. That is, in the light-emitting unit 00 at this point, the pixel circuit 10 electrically connected to the light-emitting element 20 may need to drive and control at least the second light-emitting part 20B in the light-emitting element 20 to emit light. The side of the second light-emitting part 20B away from the substrate 01 may not be disposed with any structure that changes the light-emitting path. Therefore, the light emitted by the second light-emitting part 20B may freely exit according to its own performance, and the light finally emitted from the light-emitting surface of the light-emitting panel 000 may be divergent large-angle light, that is, the light-emitting range of a wide viewing angle, thereby realizing the second light-emitting mode with wide viewing angle of the light-emitting panel 000.

In the light-emitting panel 000 of one embodiment, the light-emitting element 20 with simple structure may include the plurality of light-emitting parts 200; the collimation structure 30 may be disposed above one of the light-emitting parts 200, that is, the first light-emitting part 20A; the light-emitting panel 000 may be freely switched between a wide viewing angle and a narrow viewing angle through the control of the pixel circuit 10; and the design of complicated viewing angle switching structure such as the light guiding plate, the light bar, and the double liquid crystal box in the existing technology may be cancelled, which may be beneficial for reducing panel thickness. In such way, the display panel may not only have simple structure and low cost, but also realize the switch between wide and narrow viewing angles without complicated drive control circuits and have low power consumption; and the light-emitting effects in both wide viewing angle and narrow viewing angle modes may be effectively ensured.

Figure 4:
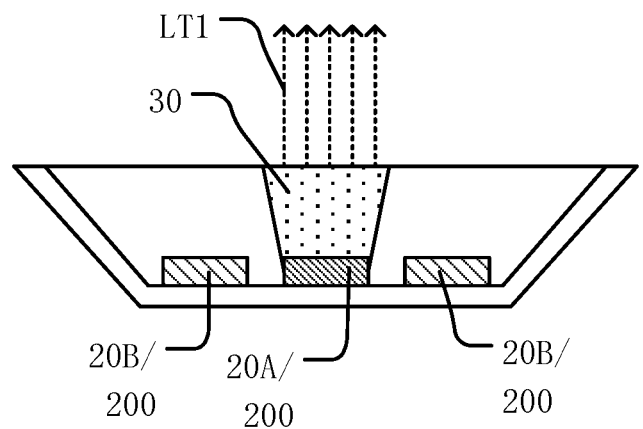
FIG. 4 illustrates another cross-sectional structural view of a light-emitting element according to various embodiments of the present disclosure.
Figure 5:
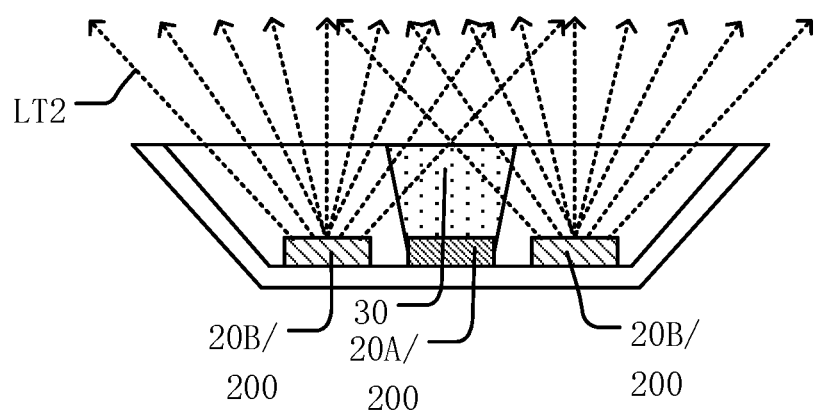
FIG. 5 illustrates another cross-sectional structural view of a light-emitting element according to various embodiments of the present disclosure.

It may be understood that, in one embodiment, one light-emitting element 20 including one first light-emitting part 20A and one second light-emitting part 20B is taken as an example for illustration in FIG. 3. Optionally, at this point, the light-emitting area of the second light-emitting part 20B may be set to be greater than or equal to the light-emitting area of the first light-emitting part 20A, that is, overall volume of the second light-emitting part 20B may be set to be greater than or equal to overall volume of the first light-emitting part 20A, thereby being beneficial for ensuring the light-emitting effect (large viewing angle) of the light-emitting panel 000 in the second light-emitting mode with wide viewing angle. FIG. 4 illustrates another cross-sectional structural view of a light-emitting element according to various embodiments of the present disclosure. FIG. 5 illustrates another cross-sectional structural view of a light-emitting element according to various embodiments of the present disclosure. In some other optional embodiments, when one light-emitting element 20 includes one first light-emitting part 20A and at least two second light-emitting parts 20B, at least two second light-emitting parts 20B may be respectively disposed on two sides of one first light-emitting part 20A. Or in some other optional embodiments, when one light-emitting element 20 includes one first light-emitting part 20A and a plurality of second light-emitting parts 20B, the plurality of second light-emitting parts 20B may be evenly arranged around one first light-emitting part 20A, thereby being beneficial for uniformity of light emitted by at least two second light-emitting parts 20B on two sides of one first light-emitting part 20A in the light-emitting element 20. In one embodiment, FIG. 4 can also be understood as a schematic diagram of the light-emitting of the light-emitting panel 000 in the first light-emitting mode, and FIG. 5 can also be understood as a schematic diagram of the light-emitting of the light-emitting panel 000 in the second light-emitting mode. When the light-emitting panel 000 shown in FIG. 5 is in the second light-emitting mode, the pixel circuit 10 may at least control the second light-emitting part 20B of the light-emitting element 20 electrically connected to the pixel circuit 10 to emit light. At this point, the pixel circuit 10 electrically connected to the light-emitting element 20 in the light-emitting unit 00 may need to drive and control at least the second light-emitting part 20B of the light-emitting element 20 to emit light. The side of the second light-emitting part 20B away from the substrate 01 is not disposed with any structure that changes the light-emitting path. Therefore, the light emitted by the second light-emitting part 20B may freely exit according to its own performance, and the light finally emitted from the light-emitting surface of the light-emitting panel 000 may be divergent large-angle light (for example, the light LT2 shown in FIG. 5), that is, the light-emitting range of a wide viewing angle, thereby realizing the second light-emitting mode of the light-emitting panel 000 with wide viewing angle.

It may be understood that, in one embodiment, the shape of the light-emitting unit 00 along the direction of the plane where the substrate 01 is located is a square as an example for illustration in FIG. 1. During an implementation, the shape of the light-emitting unit 00 may include, but may not be limited to, above-mentioned shape, and may also include other shapes, which may not be limited in one embodiment.

It should be noted that, in one embodiment, the pixel circuit 10 and the light-emitting element 20 are exemplarily illustrated in blocks in FIG. 1. During an implementation, the electrical connection structure of the pixel circuit 10 and the light-emitting element 20 may be selected and set according to actual needs, which may be understood by referring to the connection structure of the pixel circuit and the light-emitting element in the existing technology and may not be limited in one embodiment.

It should be further noted that, in one embodiment, the structure of the light-emitting panel is exemplarily illustrated in drawings. During an implementation, the structure of the light-emitting panel may include, but may not be limited to, such structure and may also include other structures capable of realizing the display function. Details may refer to the structure of the mini LED or micro LED light-emitting panel in the existing technology, which may not be described in detail in one embodiment.

In some optional embodiments, referring to FIGS. 1, 2, 4 and 6, FIG. 6 illustrates another cross-sectional structural view of a light-emitting element according to various embodiments of the present disclosure. In one embodiment, in the second light-emitting mode of the light-emitting panel 000, the pixel circuit 10 may also control the first light-emitting part 20A of the light-emitting element 20, which is electrically connected to the pixel circuit 10, to emit light.

Figure 6:
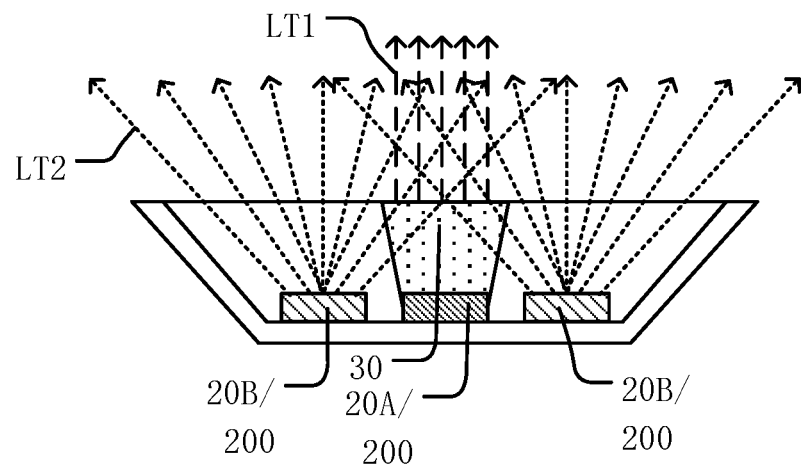
FIG. 6 illustrates another cross-sectional structural view of a light-emitting element according to various embodiments of the present disclosure.

In one embodiment, it describes that when one light-emitting element 20 includes one first light-emitting part 20A and at least two second light-emitting parts 20B, at least two second light-emitting parts 20B may be respectively arranged on two sides of one first light-emitting part 20A; or in some other optional embodiments, when one light-emitting element 20 includes one first light-emitting part 20A and the plurality of second light-emitting parts 20B, the plurality of second light-emitting parts 20B may be evenly arranged around one first light-emitting part 20A. FIG. 6 can also be understood as a light-emitting schematic of the light-emitting panel 000 in the second light-emitting mode. When the light-emitting panel 000 shown in FIG. 6 is in the second light-emitting mode, the pixel circuit 10 may at least control the second light-emitting part 20B of the light-emitting element 20, which is electrically connected to the pixel circuit 10, to emit light; and the pixel circuit 10 may also control the first light-emitting part 20A of the light-emitting element 20, which is electrically connected to the pixel circuit 10, to emit light. That is, in the second light-emitting mode of the light-emitting panel 000, the pixel circuit 10 may control both the first light-emitting part 20A and the second light-emitting part 20B of the light-emitting element 20, which are electrically connected to the pixel circuit 10, to emit light. At this point, the pixel circuit 10 electrically connected to the light-emitting element 20 in the light-emitting unit 00 may need to drive and control the first light-emitting part 20A and the second light-emitting part 20B in the light-emitting element 20 to emit light. The side of the first light-emitting part 20A away from the substrate 01 may be disposed with the collimation structure 30, which emits the collimated light LT1 as shown in FIG. 6. However, the side of the second light-emitting part 20B away from the substrate 01 may not be disposed with any structure that changes the light-emitting path. Therefore, the light emitted by the second light-emitting part 20B may freely exit according to its own performance, and the light finally emitted from the light-emitting surface of the light-emitting panel 000 may be divergent large-angle light, such as the light LT2 shown in FIG. 6. Furthermore, in the second light-emitting mode, the light-emitting element 20 may emit light in a wide viewing angle range including the collimated light LT1 and large-angle light LT2, which may be beneficial for improving the light-emitting brightness and light-emitting effect of the light-emitting panel 000 in the second light-emitting mode with wide viewing angle.

In some optional embodiments, referring to FIGS. 1-7, FIG. 7 illustrates a structural schematic of a light-emitting element according to various embodiments of the present disclosure. In one embodiment, the light-emitting element 20 may include a cathode 201 and at least two anodes 202.

Each light-emitting part 200 may include a first electrode 2001 and a second electrode 2002. In one light-emitting element 20, the first electrodes 2001 of the plurality of light-emitting parts 200 may be all connected to a same cathode 201; and the second electrode 2002 of the first light-emitting part 20A may be connected to one anode 202, and the second electrode 2002 of the second light-emitting part 20B may be connected to another anode 202.

Figure 7:
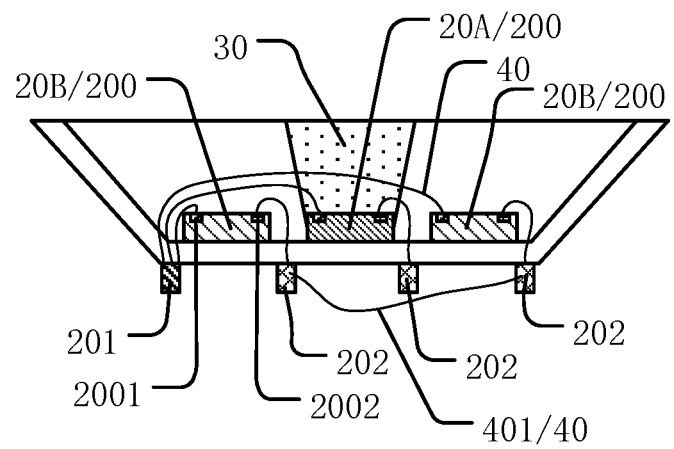
FIG. 7 illustrates a structural schematic of a light-emitting element according to various embodiments of the present disclosure.

In one embodiment, it describes that when the light-emitting element 20 itself includes at least two light-emitting parts 200, that is, the first light-emitting part 20A and the second light-emitting part 20B, and when the light-emitting element 20 is bound to the film layer structure on the substrate 10, for example, when the light-emitting element 20 is bound to the conductive soldering pad layer (not shown in drawings) on the substrate 01, external of one light-emitting element 20 may include one cathode 201 and at least two anodes 202. The cathode 201 may be bound to a same cathode soldering pad on the conductive soldering pad layer, and the anodes 202 may be bound to different anode soldering pads on the conductive soldering pad layer (not shown in drawings), thereby independently controlling different light-emitting parts 200 of a same light-emitting element 20. In one embodiment, each light-emitting part in a same light-emitting element 20 may include the first electrode 2001 and the second electrode 2002 respectively, and the first electrodes 2001 of the plurality of light-emitting parts 200 in one light-emitting element 20 may be all connected to a same cathode 201. Optionally, as shown in FIG. 7, the first electrodes 2001 of different light-emitting parts 200 may be connected to a same cathode 201 through conductive metal wires, thereby realizing conductive transmission performance. However, in different light-emitting parts 200 of a same light-emitting element 20, the second electrode 2002 of the first light-emitting part 20A may be connected to one anode 202, and the second electrode 2002 of the second light-emitting part 20B may be connected to another anode 202; and whether different light-emitting parts 200 are conductive is controlled by different anodes 202 on the light-emitting element 20. Optionally, as shown in FIG. 7, the second electrodes 2002 of different light-emitting parts 200 may be connected to corresponding anodes 202 through conductive metal wires, thereby realizing conductive transmission performance. When one anode 202 connected to the second electrode 2002 of the first light-emitting part 20A is inputted with a drive signal, the first light-emitting part 20A may emit light; when another anode 202 connected to the second electrode 2002 of the second light-emitting part 20B is inputted with a drive signal, the second light-emitting part 20B may emit light; and when both the anode 202 connected to the second electrode 2002 of the first light-emitting part 20A and another anode 202 connected to the second electrode 2002 of the second light-emitting part 20B are inputted with a drive signal, both the first light-emitting part 20A and the second light-emitting part 20B of the light-emitting element 20 may emit light. The cathode 201 and anode 202 of the light-emitting element 20 are bound in the film layer on the substrate 01 and are electrically connected to the pixel circuit 10, such that the pixel circuit 10 can control whether each anode 202 of the light-emitting element 20 is in conduction or not, thereby controlling the light-emitting of different light-emitting parts 200.

It may be understood that, in one embodiment, the quantity of anodes 202 included in the light-emitting element 20 may not be limited, which may only need to satisfy that the first light-emitting part 20A has one single corresponding anode 202, and the second light-emitting part 20B has at least one single corresponding anode 202, thereby realizing separate light-emitting of two different light-emitting parts 200. During an implementation, the quantity of anodes 202 included in one light-emitting element 20 may be set according to actual requirements, which may not be described in detail in one embodiment.

Figure 8:
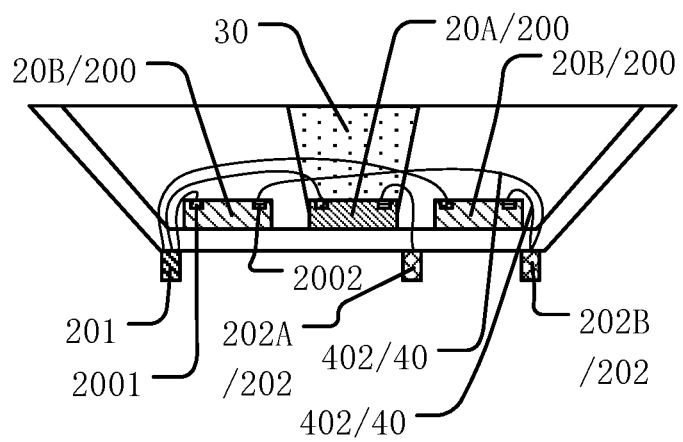
FIG. 8 illustrates another structural schematic of a light-emitting element according to various embodiments of the present disclosure.

It may be understood that, as shown in FIG. 7, when the light-emitting element 20 in one embodiment includes one first light-emitting part 20A and the plurality of second light-emitting parts 20B, one first light-emitting part 20A may correspond to one anode 202, and different second light-emitting parts 20B may correspond to different anodes 202, that is, the quantity of anodes 202 included in the light-emitting element 20 may be same as the quantity of light-emitting parts 200 included in the light-emitting element 20. In one embodiment, different second light-emitting parts 20B may correspond to different anodes 202, that is, different second light-emitting parts 20 in a same light-emitting element 20 may be connected and controlled by separate anodes 202, such that precise control of whether different second light-emitting parts 20B emit light may be realized. In such way, it may avoid the phenomenon that all second light-emitting parts 20B cannot emit light if there is an electrical connection problem of the same anode when all second light-emitting parts 20B are connected to the same anode, thereby being beneficial for ensuring light-emitting effect. Optionally, in one embodiment, the anodes 202 corresponding to different second light-emitting parts 20B may be connected to each other, for example, may be connected to each other through conductive metal wires 40, such that different second light-emitting parts 20B may be controlled synchronously through different anodes 202. Or as shown in FIG. 8, FIG. 8 illustrates another structural schematic of a light-emitting element according to various embodiments of the present disclosure. When the light-emitting element 20 in one embodiment includes one first light-emitting part 20A and the plurality of second light-emitting parts 20B, one first light-emitting part 20A may correspond to one anode 202, and different second light-emitting parts 20B may correspond to one anode 202. That is, the light-emitting element 20 may be only disposed with two anodes 202, and the second electrodes 2002 of different second light-emitting parts 20B may be connected to a same anode 202. For example, the second electrodes 2002 of different second light-emitting parts 20B may be connected to a same anode 202 through conductive metal wires 40, so that different second light-emitting parts 20B may be synchronously controlled through a same anode 202.

It may be understood that, in one embodiment, FIG. 7 may exemplarily illustrate a connection manner when the anodes 202 corresponding to different second light-emitting parts 20B are connected to each other through conductive metal wires 40. During an implementation, the connection manner of the conductive metal wires may include, but may not be limited to, such manner and may also be other connection structures. For example, in an actual implementation, the conductive metal wires that play a connection role may be disposed at positions of the light-emitting element 20 away from the light-emitting surface and the like as required, which may only need to satisfy that the second electrodes 2002 of different light-emitting parts 200 may be connected to corresponding anodes 202 through conductive metal wires, and corresponding anodes 202 of different second light-emitting parts 20B may be connected to each other through conductive metal wires. In one embodiment, FIG. 8 may only exemplarily illustrate a connection manner that the second electrodes 2002 of different second light-emitting parts 20B are connected to a same common anode 202. During an implementation, the connection manner of the conductive metal wires may include, but may not be limited to, such manner and may also be other connection structures. For example, in an actual implementation, the conductive metal wires that play a connection role may be disposed at positions of the light-emitting element 20 away from the light-emitting surface and the like as required, which may only need to satisfy that the second electrodes 2002 of different second light-emitting parts 20B may be connected to a same anode 202, so that different second light-emitting parts 20B may realize synchronous control through a same anode 202, which may not be described in detail in one embodiment.

Optionally, referring to FIGS. 1-7, in one embodiment, in one light-emitting element 20, the anodes 202 corresponding to the second light-emitting part s20B may be connected to each other through the first connection wire 401.

In one embodiment, it describes that in each light-emitting unit 00 of the light-emitting panel 000, one light-emitting element 20 may include one first light-emitting part 20A and the plurality of second light-emitting parts 20B. At this point, one first light-emitting part 20A may correspond to one anode 202, and different second light-emitting parts 20B may also correspond to different anodes 202 respectively, that is, the quantity of anodes 202 included in the light-emitting element 20 may be same as the quantity of light-emitting parts 200 included in the light-emitting element 20. At this point, different second light-emitting parts 20 in a same light-emitting element 20 may be connected and controlled by separate anodes 202, such that precise control of whether different second light-emitting parts 20B emit light may be realized. In such way, it may avoid the phenomenon that all second light-emitting parts 20B cannot emit light if there is an electrical connection problem of the same anode when all second light-emitting parts 20B are connected to the same anode, thereby being beneficial for ensuring light-emitting effect. Furthermore, optionally, in one light-emitting element 20 in one embodiment, the anodes 202 corresponding to different second light-emitting parts 20B may be connected to each other through the first connection wire 401, so that the anodes 202 of different second light-emitting parts 20B may be connected to each other. The first connection wire 401 may be a conductive metal wire, which is convenient for wire bonding and has desirable electrical conductivity. Furthermore, different second light-emitting parts 20B may be controlled synchronously through different anodes 202. When binding the light-emitting element 20 in the film layer structure on the side of the substrate 01 of the light-emitting panel 000, only one conductive soldering pad may be disposed to be bound with and electrically connect to one anode 202 corresponding to one first light-emitting part 20A, and only one conductive soldering pad may be provided to be bound with and electrically connect to one anode 202 corresponding to one second light-emitting part 20B, which may be beneficial for reducing the quantity of conductive soldering pads in the light-emitting panel 000 and improving space utilization rate of the panel.

Optionally, referring to FIGS. 1-6 and 8, in one embodiment, the plurality of light-emitting parts 200 in one light-emitting element 20 may include one first light-emitting part 20A and at least two second light-emitting parts 20B. The plurality of light-emitting parts 200 in one light-emitting element 20 may include one first light-emitting part 20A and two second light-emitting parts 20B as an example for illustration in FIGS. 1-6 and 8. During an implementation, the light-emitting element 20 may include a larger quantity of second light-emitting parts 20B.

In one light-emitting element 20, the second electrode 2002 of the first light-emitting part 20A may be connected to one anode 202, and the second electrodes 2002 of other second light-emitting parts 20B may share one anode 202.

In one embodiment, it describes that, in each light-emitting unit 00 of the light-emitting panel 000, when one light-emitting element 20 includes one first light-emitting part 20A and at least two second light-emitting parts 20B, one first light-emitting part 20A may correspond to one anode 202, and different second light-emitting parts 20B may jointly correspond to one anode 202. That is, the light-emitting element 20 may be only disposed with two anodes 202, and the second electrodes 2002 of different second light-emitting parts 20B may be jointly connected to a same anode 202 through the second connection wires 402. For example, the second electrodes 2002 of different second light-emitting parts 20B may be connected to a same anode 202 through conductive metal wires, so that different second light-emitting parts 20B may be controlled synchronously through a same anode 202. In such way, the structure may be simple; and when the light-emitting element 20 is bound in the film layer structure on the side of the substrate 01 of the light-emitting panel 000, only one conductive soldering pad may be disposed to be electrically connected to one anode 202 corresponding to one first light-emitting part 20A, and one conductive soldering pad may be electrically connected to one anode 202 corresponding to all second light-emitting parts 20B, which may be beneficial for reducing the quantity of conductive soldering pads in the light-emitting panel 000 and improving space utilization rate of the panel.

In some optional embodiments, referring to FIGS. 1-6 and 8-9, one light-emitting element 20 may include two anodes 202 which are respectively a first anode 202A and a second anode 202B; the first anode 202A may be connected to the second electrode 2002 of the first light-emitting part 20A; and the second anode 202B may be connected to the second electrode 2002 of the second light-emitting part 20B.

In one embodiment, it describes that a same light-emitting element 20 may only be disposed with two anodes 202 which are respectively the first anode 202A and the second anode 202B. The first anode 202A may be connected to the second electrode 2002 of one first light-emitting part 20A in the light-emitting element 20, the second anode 202B may be connected to the second electrodes 2002 of all second light-emitting parts 20B in the light-emitting element 20. In such way, the second electrodes 2002 of different second light-emitting parts 20B may be connected to a same anode 202 through second connection wires 402 such as conductive metal wires, and different second light-emitting parts 20B may be controlled synchronously through a same anode 202. When binding the light-emitting element 20 in the film layer structure on the side of the substrate 01 of the light-emitting panel 000, it may configure that only one conductive soldering pad may be electrically connected to one cathode 201 corresponding to all light-emitting parts 200, one conductive soldering pad may be bound and electrically connected to an anode 202 corresponding to one first light-emitting part 20A. One conductive soldering pad may be bound and electrically connected to one anode 202 corresponding to all second light-emitting parts 20B, which may be beneficial for reducing the quantity of conductive soldering pads in the light-emitting panel 000 and improving space utilization rate of the panel.

In some optional embodiments, referring to FIGS. 1, 2, 4-6 and 8-9, FIG. 9 illustrates a top structural view of an anode and a cathode of a light-emitting element in FIG. 8. In one embodiment, along the direction perpendicular to the plane where the substrate 01 is located, the orthographic projection of the cathode 201 may be configured to surround the orthographic projection of the first anode 202A; and the orthographic projection of the second anode 202B may be configured to surround the orthographic projection of the cathode 201.

The shape of the orthographic projection of the first anode 202A on the substrate 01 may be a block shape, the shape of the orthographic projection of the cathode 201 on the substrate 01 may be a ring shape, and the shape of the orthographic projection of the second anode 202B on the substrate may be a ring shape.

Figure 9:
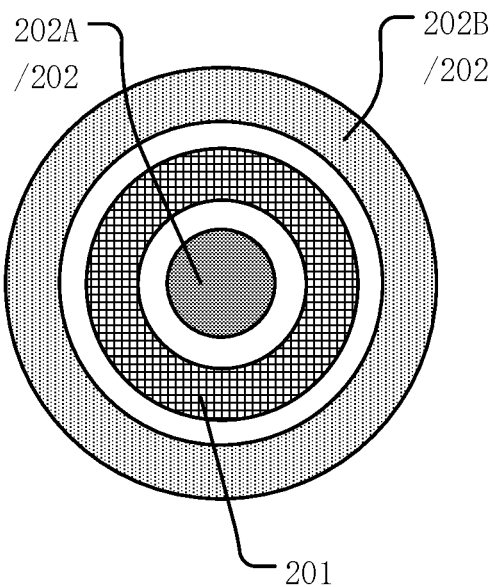
FIG. 9 illustrates a top structural view of an anode and a cathode of a light-emitting element in FIG. 8.

In one embodiment, it describes that one light-emitting element 20 may only include one cathode 201 and two anodes 202 which are respectively the first anode 202A and the second anode 202B. At this point, the top view structure of the anode 202 and the cathode 201 of the light-emitting element 20 is shown in FIG. 9. The shape of the orthographic projection of the first anode 202A on the substrate 01 may be a block shape, the shape of the orthographic projection of the cathode 201 on the substrate 01 may be a ring shape, and along the direction perpendicular to the plane where the substrate 01 is located, the orthographic projection of the cathode 201 may be configured to surround the orthographic projection of the first anode 202A. The orthographic shape of the second anode 202B on the substrate may be also a ring shape, and along the direction perpendicular to the plane where the substrate 01 is located, the orthographic projection of the second anode 202B may be configured to surround the orthographic projection of the ring-shaped cathode 201. That is, the first anode 202A electrically connected to the second electrode 2002 of the first light-emitting part 20A may be at innermost, and may be arranged in a block shape, such as a ring shape, a square shape, or a polygonal shape, which may not be limited in one embodiment. In addition, the cathode 201 electrically connected to the first electrodes 2001 of all light-emitting parts 200 may be a ring structure and configured to surround the first anode 202A, and the first anode 202A and the cathode 201 may be insulated from each other. The second anode 202B electrically connected to the second electrodes 2002 of all second light-emitting parts 20B of the light-emitting element 20 may be also configured as an outermost ring structure to surround the ring-shaped cathode 201, and the second anode 202B and the cathode 201 may be insulated from each other. Therefore, the cathode and anode structure of the light-emitting elements 20 that the ring-shaped structures surround each other may be formed as a whole. Furthermore, when the plurality of light-emitting parts 200 of a same light-emitting element 20 are arranged, it is convenient to arrange the first light-emitting part 20A in the middle and arrange remaining plurality of second light-emitting parts 20B to surround the first light-emitting part 20B; the stability of the electrical connection between the first electrode 2001 and the cathode 201 of the second light-emitting part 20B may be ensured; and the stability of the electrical connection between the second electrode 2002 of the second light-emitting part 20B and the second anode 202B may be ensured.

Figure 10:
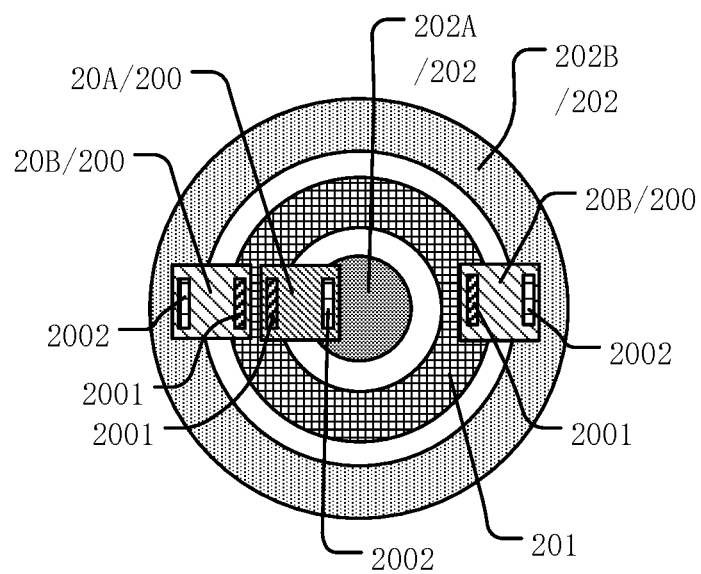
FIG. 10 illustrates a top structural view of a light-emitting element in FIG. 8.
Figure 11:
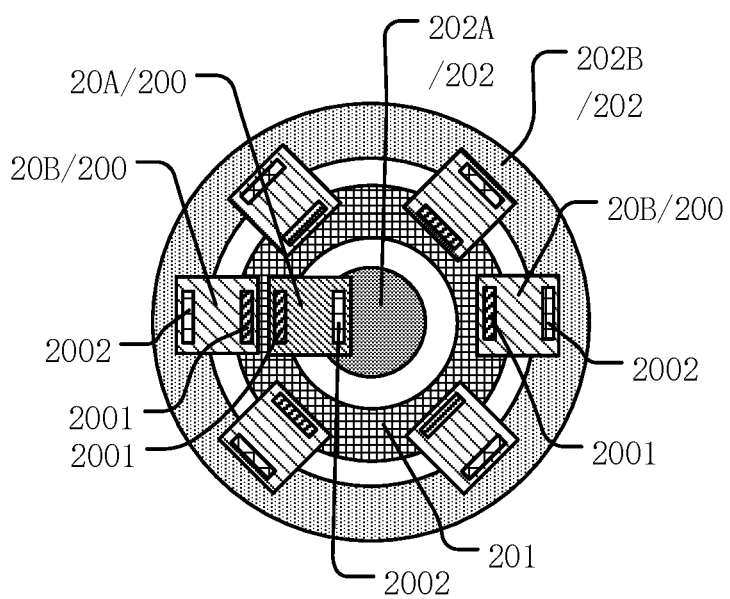
FIG. 11 illustrates another top structural view of a light-emitting element in FIG. 8.

Optionally, as shown in FIG. 10, FIG. 10 illustrates a top structural view of a light-emitting element in FIG. 8. When the light-emitting element 20 includes one first light-emitting part 20A and two second light-emitting parts 20B, the layout structure of the light-emitting part 200 and the anode 202 and the cathode 201 of the light-emitting element 20 is shown in FIG. 10, and two second light-emitting parts 20B may be respectively on two sides of one first light-emitting part 20A. Optionally, as shown in FIG. 11, FIG. 11 illustrates another top structural view of a light-emitting element in FIG. 8. When the light-emitting element 20 includes one first light-emitting part 20A and the plurality of second light-emitting parts 20B, the layout structure of the light-emitting part 200 and the anode 202 and the cathode 201 of the light-emitting element 20 is shown in FIG. 11, and the plurality of second light-emitting parts 20B may be configured to surround one first light-emitting part 20A. The quantity of light-emitting parts 200 included in the light-emitting element 20 may not be limited in one embodiment. During an implementation, the layout structure of the light-emitting part 200 and the anode 202 and cathode 201 of the light-emitting element 20 may be reasonably set according to the quantity of light-emitting parts 200.

Optionally, the shape of the orthographic projection of the first anode 202A on the substrate 01 in one embodiment may be circular, the first anode 202A may be electrically connected to the second electrode 2002 of the first light-emitting part 20A correspondingly, and the side of the first light-emitting part 20A away from the substrate 01 may be disposed with the collimation structure 30 such as a lens structure. Therefore, the shape of the orthographic projection of the first anode 202A on the substrate 01 may be designed to be circular, which can match the collimation structure 30 such as the lens structure, so that the design of the light-emitting element 20 itself may be more reasonable.

Figure 12:
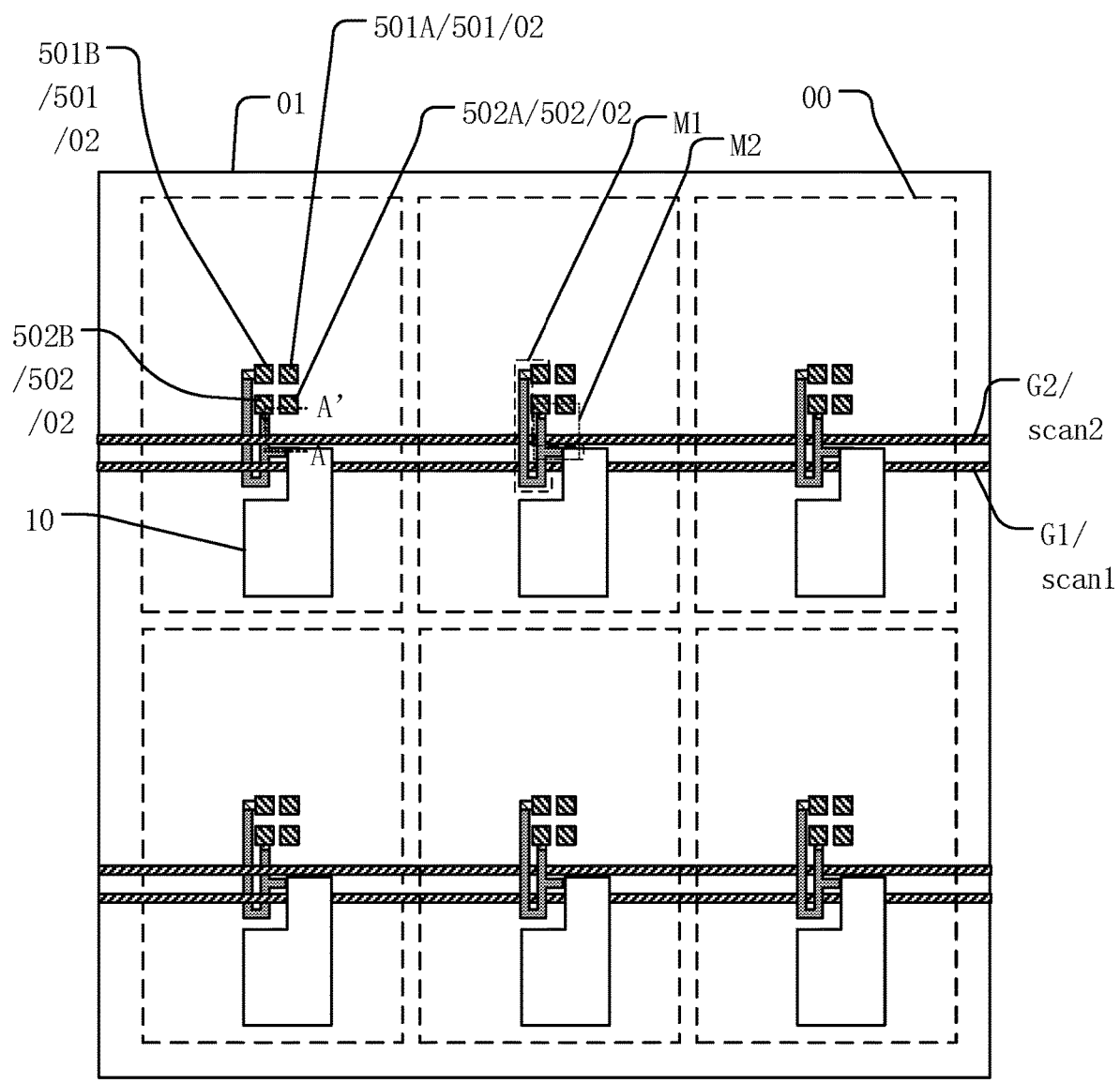
FIG. 12 illustrates a planar structural view of a partial structure of a light-emitting unit in a local region on a substrate in FIG. 1.
Figure 13:
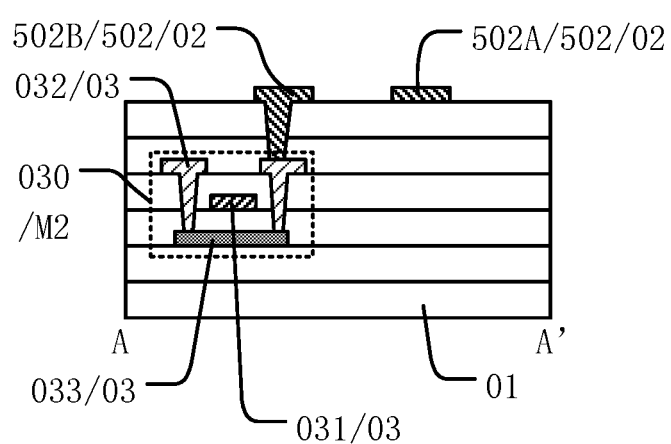
FIG. 13 illustrates a cross-sectional schematic along an A-A' direction in FIG. 12.

In some optional embodiments, referring to FIGS. 1, 2, 4-6, 8-9, and 12-13, FIG. 12 illustrates a planar structural view of a partial structure of a light-emitting unit in a local region on the substrate in FIG. 1; and FIG. 13 illustrates a cross-sectional schematic along an A-A' direction in FIG. 12. It may be understood that, in order to clearly illustrate the structure in one embodiment, transparency is filled in FIG. 12. In one embodiment, the light-emitting panel 000 may include a conductive soldering pad layer 02 on a side of the substrate 01.

The conductive soldering pad layer 02 may include a plurality of first soldering pad groups 501 and a plurality of second soldering pad groups 502; the first soldering pad group 501 may include a first soldering pad 501A and a second soldering pad 501B; and the second soldering pad group 502 may include a third soldering pad 502A and a fourth soldering pad 502B.

In one light-emitting element 20, the cathode 201 may be bound to the first soldering pad 501A and the third soldering pad 502A respectively; the anode 202 connected to the first light-emitting part 20A may be bound to the second soldering pad 501B; and the anode 202 connected to the second light-emitting part 20B may be bound to the fourth soldering pad 502B.

In one embodiment, it describes that the film layer structure of the light-emitting panel 000 may include the conductive soldering pad layer 02 on a side of the substrate 01. An optional thin film transistor array layer 03 may also be included between the conductive soldering pad layer 02 and the substrate 01. The thin film transistor array layer 03 may include a gate metal layer 031, a source-drain metal layer 032, a semiconductor layer 033 and the like. The thin film transistor array layer 03 may be configured to manufacture a plurality of thin film transistor structures 030 and capacitor structures (not shown in drawings) included in the pixel circuit 10, which may not be described in detail herein. The conductive soldering pad layer 02 may be disposed on a side of the thin film transistor array layer away from the substrate 01, which may be convenient to electrically connect the plurality of transistor structures and capacitor structures included in the pixel circuit 10 with subsequently bound light-emitting elements 20 through the conductive soldering pads of the conductive soldering pad layer 02. In one embodiment, the fabrication material of the conductive soldering pad layer 02 may not be limited and may be common material for soldering pad structures such as metal copper. The conductive soldering pad layer 02 in one embodiment may include the plurality of first soldering pad groups 501 and the plurality of second soldering pad groups 502. Optionally, one first soldering pad group 501 and one second soldering pad group 502 may be disposed within the range of one light-emitting unit 00. The first soldering pad group 501 may include the first soldering pad 501A and the second soldering pad 501B; and the second soldering pad group 502 may include the third soldering pad 502A and the fourth soldering pad 502B. When the light-emitting element 20 is bound within the range of the light-emitting unit 00, in one light-emitting element 20, the cathode 201 may be respectively bound to the first soldering pad 501A and the third soldering pad 502A, that is, the first soldering pad 501A of the first soldering pad group 501 and the third soldering pad 502A of the second soldering pad group 502 may be jointly bound with the cathode 201 of the light-emitting element 20. In addition, the anode 202 connected to the first light-emitting part 20A in the light-emitting element 20 may be bound to the second soldering pad 501B of the first soldering pad group 501, and the anode 202 connected to the second light-emitting part 20B may be bonded to the fourth soldering pad of the second soldering pad group 502. The first light-emitting part 20A in the light-emitting element 20 may be controlled through the first soldering pad group 501, and the second light-emitting part 20A in the light-emitting element 20 may be controlled through the second soldering pad group 502, such that it may realize disposing a reasonable quantity of conductive soldering pads within the range where the light-emitting unit 00 is located, and ensure that the first light-emitting part 20A and the second light-emitting part 20B of a same light-emitting element 20 may be independent from each other and separately controlled to emit light or not. Therefore, it may realize that only the first light-emitting part 20A of the light-emitting element 20 emits light in the first light-emitting mode of the light-emitting panel 000, and at least the second light-emitting part 20B of the light-emitting element 20 emits light in the second light-emitting mode, thereby further realizing free switching effect of a wide viewing angle and narrow viewing angle of the light-emitting panel 000.

It may be understood that, in one embodiment, the layout structure of the pixel circuit 10 within the range of each light emitting unit 00 is exemplarily illustrated in blocks in FIG. 12. In an implementation, the layout structure of the pixel circuit 10 on the substrate 01 may be designed through actual structures of transistors and capacitor devices and arranged in regions other than the first soldering pad group 501 and the second soldering pad group 502 in the light-emitting unit 00, which may not be limited in one embodiment.

In some optional embodiments, referring to FIGS. 1, 4, 5, 12, 13 and 14, FIG. 14 illustrates another electrical connection structural schematic of a light-emitting unit in FIG. 1. In one embodiment, the pixel circuit 10 may at least include a first control transistor M1 and a second control transistor M2 which are electrically connected to a same light-emitting element 20.

The first control transistor M1 may be electrically connected to the first light-emitting part 20A of one light-emitting element 20, and the second control transistor M2 may be electrically connected to the second light-emitting part 20B of one light-emitting element 20.

In one embodiment, it describes that in the light-emitting unit 00 of the light-emitting panel 000, the pixel circuit 10 fabricated on the substrate 01 may further include at least one first control transistor M1 and one second control transistor M2; and the first control transistor M1 and the second control transistor M2 may be electrically connected to a same light-emitting element 20, where the first control transistor M1 may be electrically connected to the first light-emitting part 20A of the light-emitting element 20. Optionally, the drain electrode of the first control transistor M1 may be electrically connected to one anode 202 (that is, the second soldering pad 501B) corresponding to the first light-emitting part 20A; and the second control transistor M2 may be electrically connected to all second light-emitting parts 20B of the light-emitting element 20. Optionally, the drain electrode of the second control transistor M2 may be electrically connected to another anode 202 (that is, the fourth soldering pad 502B) corresponding to all second light-emitting parts 20B of the light-emitting element 20. The drive signal provided by the gate electrode of the first control transistor M1 may control the first control transistor M1 to be in conduction or cutoff. When the first control transistor M1 is in conduction, the source and drain electrodes of the first control transistor M1 may be connected to each other, so that the drive signal provided by the pixel circuit 10 may be transmitted to one anode 202 corresponding to the first light-emitting part 20A, and the first light-emitting part 20A of the light-emitting element 20 may emit light. Optionally, the gate electrodes of the plurality of first control transistors M1 of a same row of light-emitting units 000 may be connected to a same scan control signal line, that is, the first control transistors M1 of a same row may be in conduction or cutoff simultaneously, which may be beneficial for reducing the quantity of signal lines in the panel. Similarly, the drive signal provided by the gate electrode of the second control transistor M2 may control the conduction or cut-off of the second control transistor M2. When the second control transistor M2 is in conduction, the source and drain electrodes of the second control transistor M2 may be connected to each other, so that the drive signal provided by the pixel circuit 10 may be transmitted to one anode 202 corresponding to all second light-emitting parts 20B, and the second light-emitting part 20B of the light-emitting element 20 may emit light. Optionally, the gate electrodes of the plurality of second control transistors M2 of a same row of light-emitting units 000 may be connected to a same scan control signal line, that is, the second control transistors M2 of a same row may be in conduction or cutoff simultaneously, which may be beneficial for reducing the quantity of signal lines in the panel.

It may be understood that the circuit connection structure between the pixel circuit 10 and the sources of the first control transistor M1 and the second control transistor M2 may not be limited in one embodiment. During an implementation, the structure of the pixel circuit 10 may be understood by referring to the structure of the pixel circuit which drives the light-emitting element 20 to emit light in the existing technology, which may not be limited in one embodiment.

Figure 15:
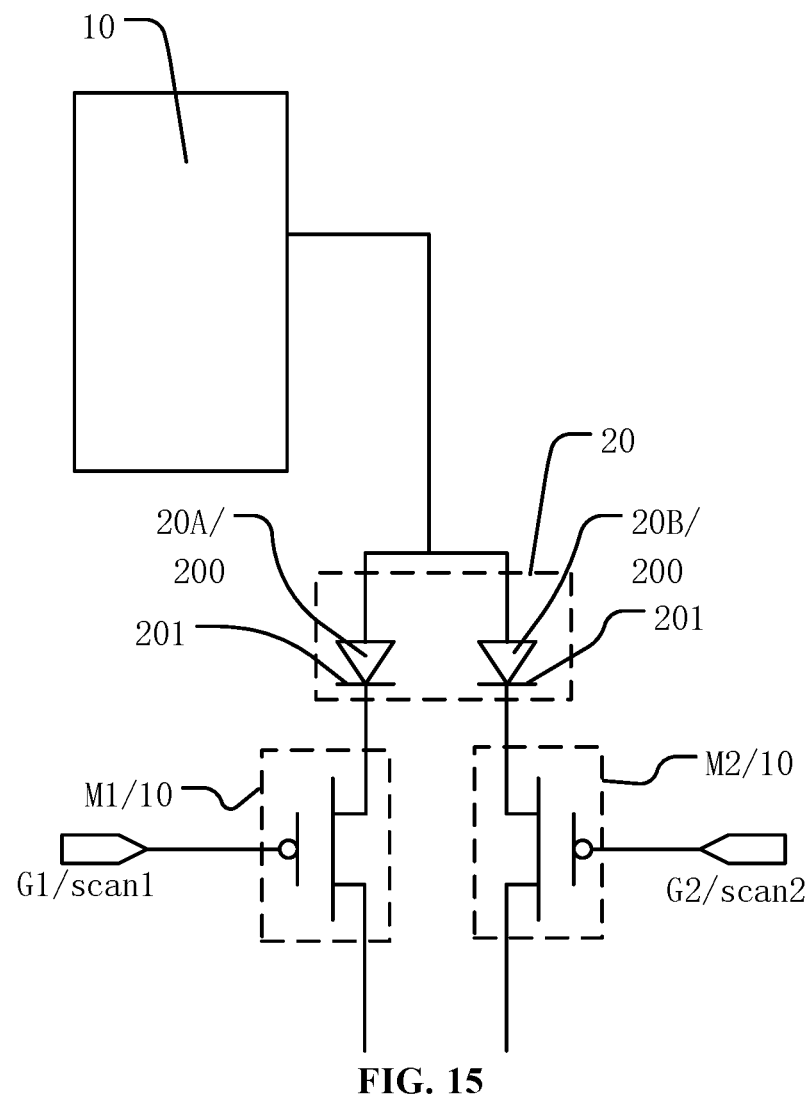
FIG. 15 illustrates another electrical connection structural schematic of a light-emitting unit in FIG. 1.
Figure 16:
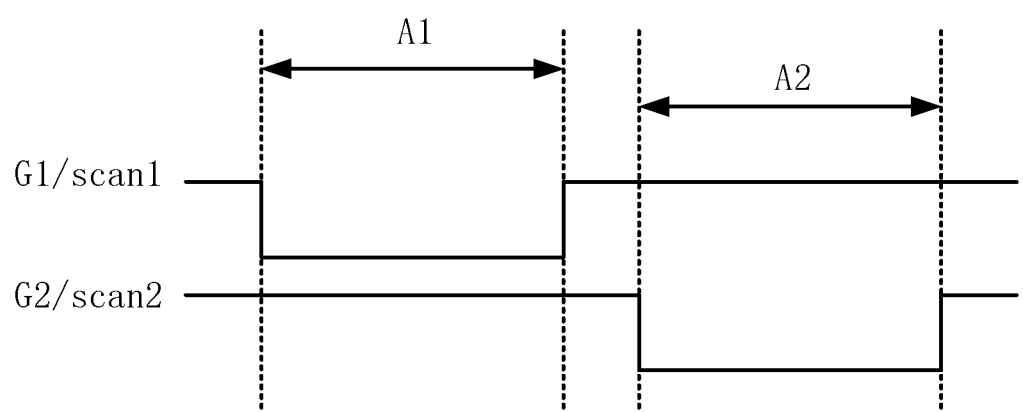
FIG. 16 illustrates a drive time sequence diagram of a gate signal of a first control transistor and a gate signal of a second control transistor in FIG. 14.
Figure 17:
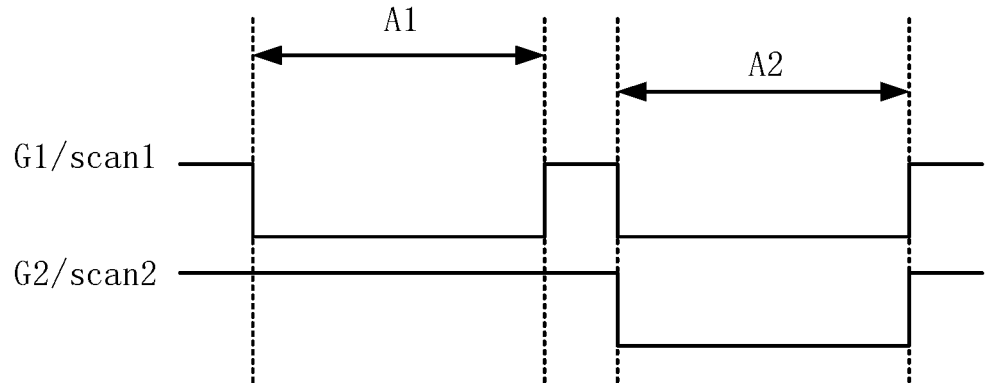
FIG. 17 illustrates another drive time sequence diagram of a gate signal of a first control transistor and a gate signal of a second control transistor in FIG. 14.
Figure 18:
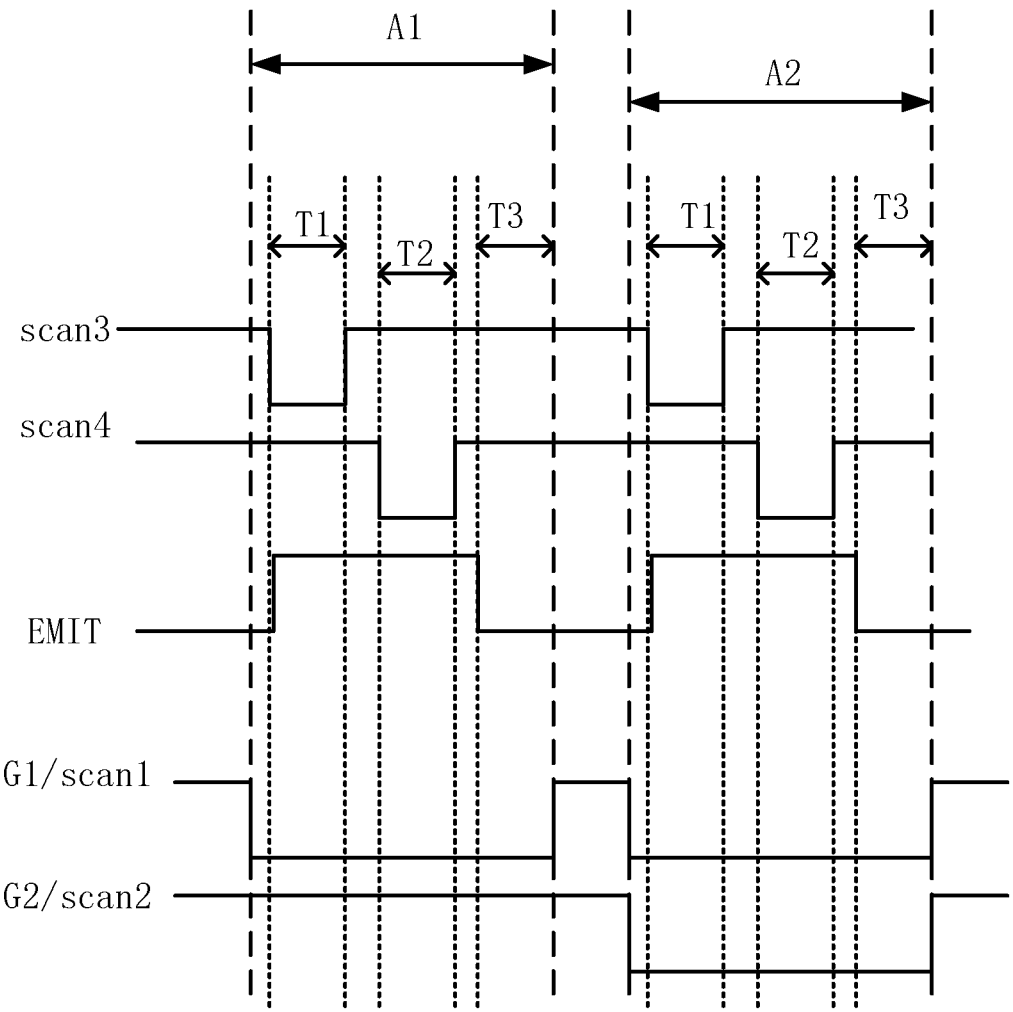
FIG. 18 illustrates a working time sequence diagram of a pixel circuit in FIG. 14 in a first light-emitting mode and a second light-emitting mode.
Figure 19:
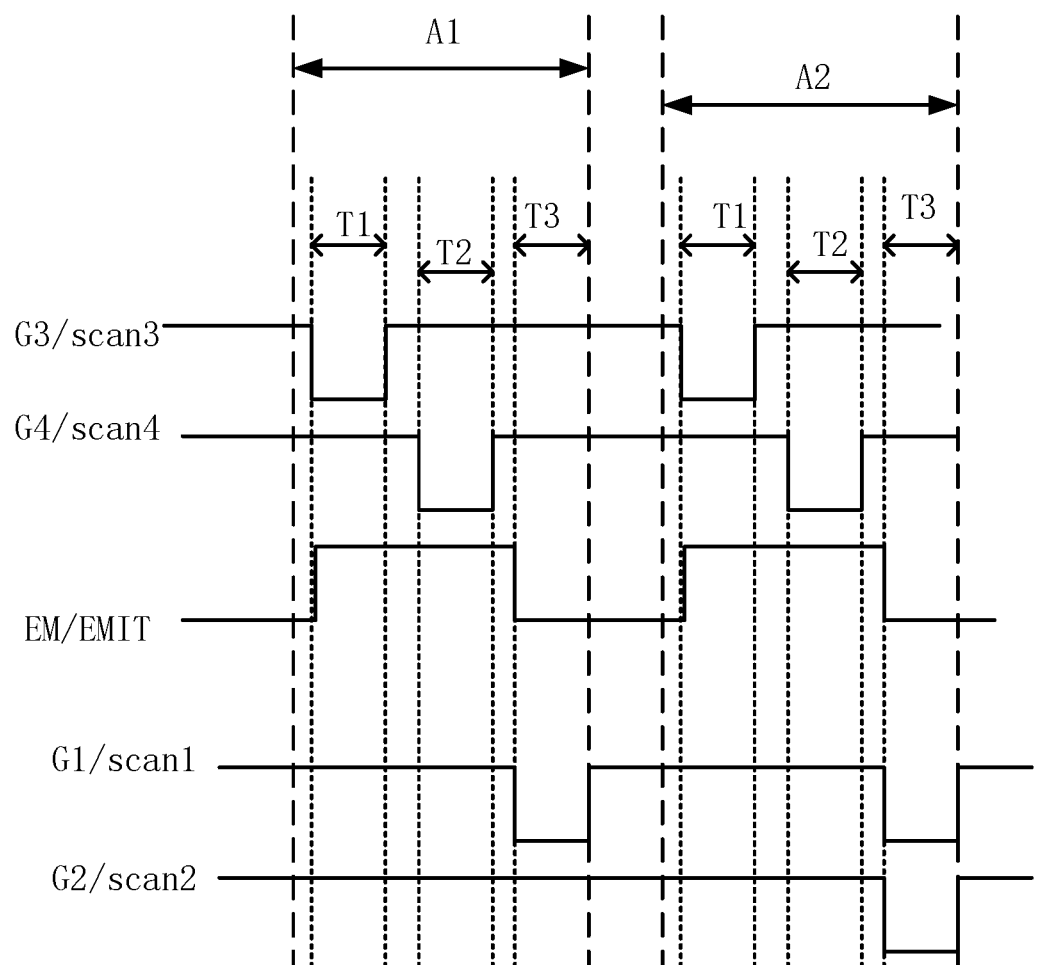
FIG. 19 illustrates another working time sequence diagram of a pixel circuit in FIG. 14 in a first light-emitting mode and a second light-emitting mode.
Figure 20:
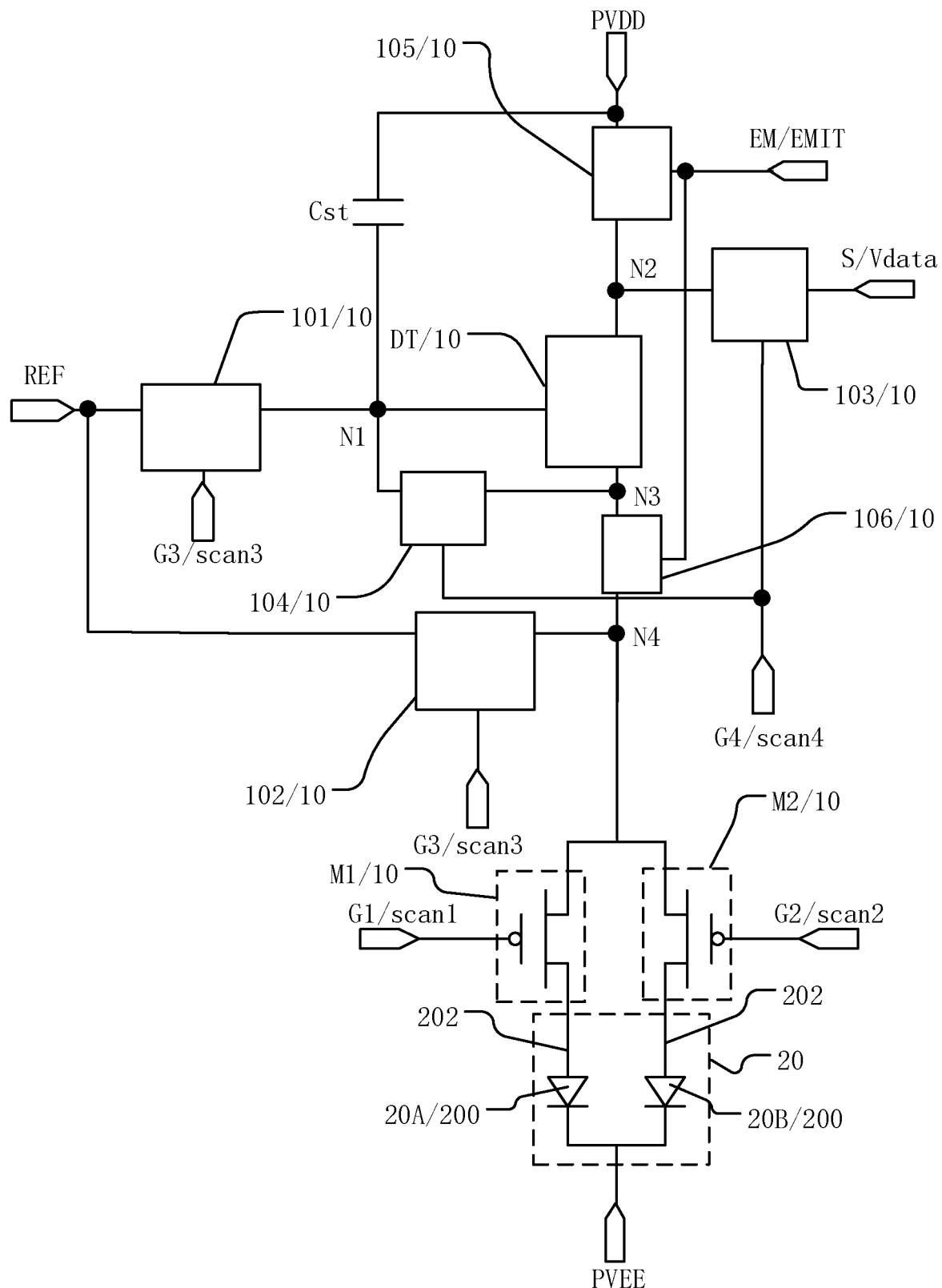
FIG. 20 illustrates another electrical connection structural schematic of a light-emitting unit in FIG. 1.

Optionally, as shown in FIG. 15, FIG. 15 illustrates another electrical connection structural schematic of a light-emitting unit in FIG. 1. In one embodiment, the pixel circuit 10 may at least include the first control transistor M1 and the second control transistor M2 which are electrically connected to a same light-emitting element 20; and the first control transistor M1 may be electrically connected to the first light-emitting part 20A of one light-emitting element 20. The structure that the second control transistor M2 is electrically connected to the second light-emitting part 20B of one light-emitting element 20 may also be shown in FIG. 15. The source electrode of the first control transistor M1 may be electrically connected to one cathode 201 of the first light-emitting part 20A, and the source electrode of the second control transistor M2 may be electrically connected to one cathode 201 of all second light-emitting parts 20B. In such way, separate control of the first light-emitting part 20A and the second light-emitting part 20B in a same light-emitting element 20 may be realized. The electrical connection manner of the first control transistor M1, the second control transistor M2 and the light-emitting element 20 may not be limited in one embodiment.

Figure 14:
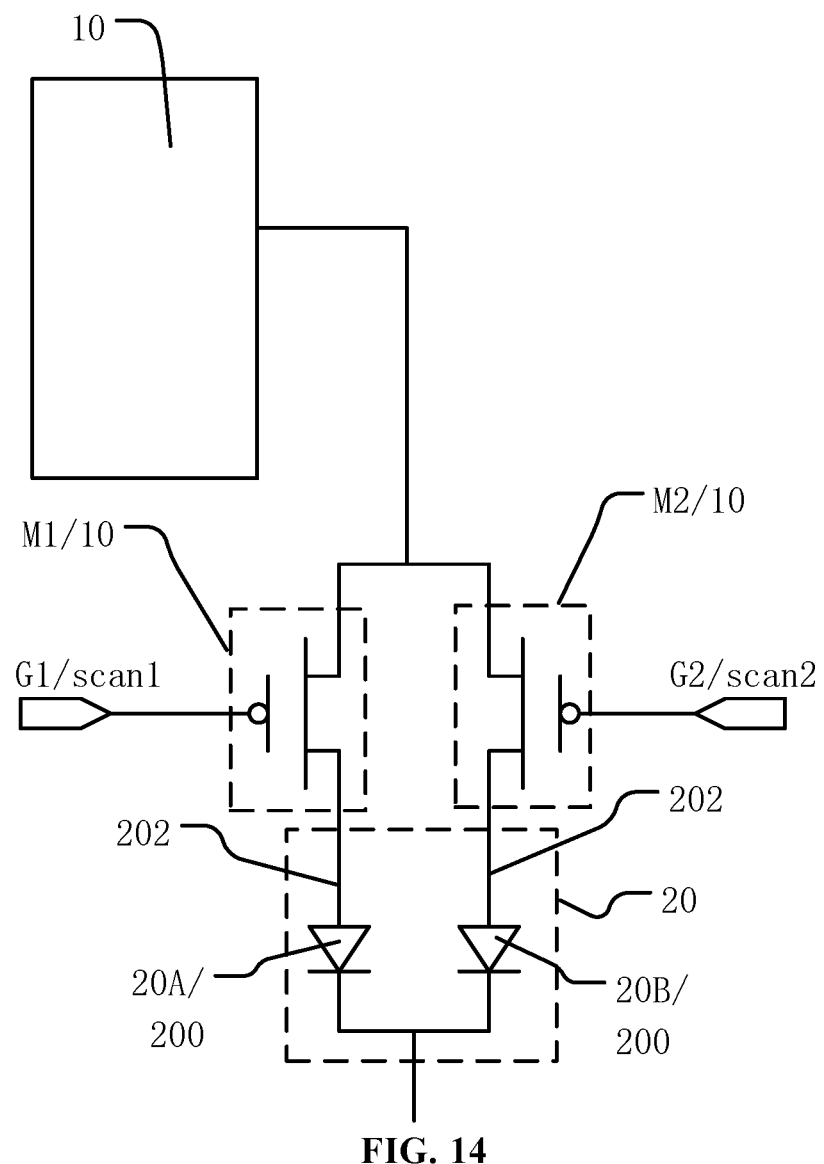
FIG. 14 illustrates another electrical connection structural schematic of a light-emitting unit in FIG. 1.

It may be understood that in one embodiment, both the first control transistor M1 and the second control transistor M2 may be P-type transistors as examples for illustration in FIGS. 14-15. During an implementation, the first control transistor M1 and the second control transistor M2 may also both be N-type transistors; or the types of the first control transistor M1 and the second control transistor M2 may be different. For example, the first control transistor M1 may be one of a P-type transistor and an N-type transistor, and the second control transistor M2 may be the other one of a P-type transistor and a N-type transistor, which may not be limited in one embodiment.

In some optional embodiments, referring to FIGS. 1, 4, 5, 12-14 and 16, FIG. 16 illustrates a drive time sequence diagram of a gate signal of the first control transistor and a gate signal of the second control transistor in FIG. 14. In one embodiment, in the first light-emitting mode A1, the first control transistor M1 may be in conduction, and the second control transistor M2 may be in cutoff; and in the second light-emitting mode A2, the first control transistor M1 may be in cutoff, and the second control transistor M2 may be in conduction.

Optionally, the gate electrode of the first control transistor M1 may be connected to the first control signal line G1, and the first electrode of the first control transistor M1 may be electrically connected to the first light-emitting part 20A; and the gate electrode of the second control transistor M2 may be connected to the second control signal line G2, and the first electrode of the second control transistor M2 may be electrically connected to the second light-emitting part 20B.

In one embodiment, it describes that in the light-emitting unit 00 of the light-emitting panel 000, the pixel circuit 10 fabricated on the substrate 01 may further at least include the first control transistor M1 and the second control transistor M2. The first control transistor M1 may be electrically connected to the first light-emitting part 20A of the light-emitting element 20, the second control transistor M2 may be electrically connected to all second light-emitting parts 20B of a same light-emitting element 20, and the first scan control signal scan1 provided by the gate electrode of the first control transistor M1 may control the first control transistor M1 to be in conduction or cutoff. Taking the first control transistor M1 of the P-type transistor as an example, when the first scan control signal scan1 provided by the gate electrode of the first control transistor M1 is a low-potential signal, the first control transistor M1 may be in conduction, and the source and drain electrodes of the first control transistor M1 may be connected to each other. That is, the first electrode of the first control transistor M1 and the first light-emitting part 20A may be in conduction. Therefore, the drive signal provided by the pixel circuit 10 may be transmitted to an anode 202 corresponding to the first light-emitting part 20A, thereby making the first light-emitting part 20A of the light-emitting element 20 emit light. Optionally, the gate electrodes of the plurality of first control transistors M1 of a same row of light-emitting units 000 may be connected to a same first control signal line G1 (as shown in FIG. 12), that is, the first control transistors M1 in a same row may be in conduction or cutoff simultaneously, which may be beneficial for reducing the quantity of signal lines in the panel. Similarly, the second scan control signal scan2 provided by the gate electrode of the second control transistor M2 may control the conduction or cut-off of the second control transistor M2. Taking the second control transistor M2 also being a P-type transistor as an example, when the second scan control signal scan2 provided by the gate electrode of the second control transistor M2 is a low-potential signal, the second control transistor M2 may be in conduction, the source and the drain electrodes of the second control transistor M2 may be connected to each other. That is, the first electrode of the second control transistor M2 may be connected to all second light-emitting parts 20B. Therefore, the drive signal provided by the pixel circuit 10 may be transmitted to one anode 202 corresponding to all second light-emitting parts 20B, thereby making the second light-emitting part 20B of the light-emitting element 20 emit light. Optionally, the gate electrodes of the plurality of second control transistors M2 of a same row of light-emitting units 000 may be connected to a same second control signal line G2 (as shown in FIG. 12), that is, the second control transistors M2 in a same row may be in conduction or cutoff simultaneously, which may be beneficial for reducing the quantity of signal lines in the panel. In one embodiment, in the first light-emitting mode A1 of the light-emitting panel 000, the low-potential first scan control signal scan1 provided by the first control signal line G1 may be controlled to make the first control transistor M1 to be in conduction; and the high-potential second scan control signal scan2 provided by the second control signal line G2 may be controlled to make the second control transistor M2 to be in cutoff. Furthermore, among the light-emitting elements 20 of each light-emitting unit 00, only the first light-emitting part 20A corresponding to the collimation structure 30 may emit light, and finally emitted light from the light-emitting element 20 may be narrow viewing angle light after passing through the collimation structure 30, thereby realizing the first light-emitting mode A1 with anti-peep effect. In the second light-emitting mode A2 of the light-emitting panel 000, the high-potential first scan control signal scan1 provided by the first control signal line G1 may be controlled to make the first control transistor M1 to be in cutoff, and the low-potential second scan control signal scan2 provided by the second control signal line G2 may be controlled to make the second control transistor M2 to be in conduction. Furthermore, among the light-emitting elements 20 of each light-emitting unit 00, at least all second light-emitting parts 20B may emit light. Since the side of the second light-emitting part 20B away from the substrate 01 is not disposed with any structure that changes the light-emitting path, the light emitted by the second light-emitting part 20B may exit freely according to its own performance. Finally, the light emitted from the light-emitting surface of the light-emitting panel 000 may be divergent large-angle light, that is, the light-emitting range of a wide viewing angle. Furthermore, the second light-emitting mode A2 of a wide viewing angle of the light-emitting panel 000 may be realized, so that free switching effect of a wide and narrow viewing angles of the light-emitting panel 000 may be realized through a simple drive sequence.

In some optional embodiments, referring to FIGS. 1, 4, 6, 12-14 and 17, FIG. 17 illustrates another drive time sequence diagram of a gate signal of the first control transistor and a gate signal of the second control transistor in FIG. 14. In one embodiment, in the first light-emitting mode A1, the first control transistor M1 may be in conduction, and the second control transistor M2 may be in cutoff; and in the second light-emitting mode A2, the first control transistor M1 may be in conduction, and the second control transistor M2 may be in conduction.

In one embodiment, it describes that in the light-emitting unit 00 of the light-emitting panel 000, the pixel circuit 10 fabricated on the substrate 01 may further include at least the first control transistor M1 and the second control transistor M2. The first control transistor M1 may be electrically connected to the first light-emitting part 20A of the light-emitting element 20, and the second control transistor M2 may be electrically connected to all second light-emitting parts 20B of a same light-emitting element 20. The first scan control signal scan1 provided by the gate electrode of the first control transistor M1 may control the first control transistor M1 to be in conduction or cutoff. Taking the first control transistor M1 of a P-type transistor as an example, when the first scan control signal scan1 provided by the gate electrode of the first control transistor M1 is a low-potential signal, the first control transistor M1 may be in conduction, the source and the drain electrodes of the first control transistor M1 may be connected to each other. In such way, the drive signal provided by the pixel circuit 10 may be transmitted to one anode 202 corresponding to the first light-emitting part 20A, so that the first light-emitting part 20A of the light-emitting element 20 may emit light. Optionally, the gate electrodes of the plurality of first control transistors M1 of a same row of light-emitting units 000 may be connected to a same first control signal line G1 (as shown in FIG. 12), that is, the first control transistors M1 in a same row may be in conduction or cutoff simultaneously, which may be beneficial for reducing the quantity of signal lines in the panel. Similarly, the second scan control signal scan2 provided by the gate electrode of the second control transistor M2 may control the conduction or cut-off of the second control transistor M2. Taking the second control transistor M2 also being a P-type transistor as an example, when the second scan control signal scan2 provided by the gate electrode of the second control transistor M2 is a low-potential signal, the second control transistor M2 may be in conduction, the source and the drain electrodes of the second control transistor M2 may be connected to each other. Therefore, the drive signal provided by the pixel circuit 10 may be transmitted to one anode 202 corresponding to all second light-emitting parts 20B, so that the second light-emitting part 20B of the light-emitting element 20 may emit light. Optionally, the gate electrodes of the plurality of second control transistors M2 of a same row of light-emitting units 000 may be connected to a same second control signal line G2 (as shown in FIG. 12). That is, the second control transistors M2 in a same row may be in conduction or cutoff simultaneously, which may be beneficial for reducing the quantity of signal lines in the panel. In one embodiment, for the light-emitting panel 000 in the first light-emitting mode A1, the low-potential first scan control signal scan1 provided by the first control signal line G1 may be controlled to make the first control transistor M1 to be conduction; and the high-potential second scan control signal scan2 provided by the second control signal line G2 may be controlled to make the second control transistor M2 to be cutoff. Furthermore, among the light-emitting elements 20 of each light-emitting unit 00, only the first light-emitting part 20A corresponding to the collimation structure 30 may emit light. Finally emitted light from the light-emitting element 20 may be narrow viewing angle light after passing through the collimation structure 30, thereby realizing the first light-emitting mode A1 with anti-peep effect. For the light-emitting panel 000 in the second light-emitting mode A2, the low-potential first scan control signal scan1 provided by the first control signal line G1 may be controlled to make the first control transistor M1 to be in conduction; and the low-potential second scan control signal scan2 provided by the second control signal line G2 may be controlled to make the second control transistor M2 to be also in conduction. Furthermore, among the light-emitting elements 20 of each light-emitting unit 00, the pixel circuit 10 may control both the first light-emitting part 20A and the second light-emitting part 20B of the light-emitting element 20 electrically connected to the pixel circuit 10 to emit light. The side of the first light-emitting part 20A away from the substrate 01 may be disposed with the collimation structure 30, which emits collimated light LT1 as shown in FIG. 6. However, the side of the second light-emitting part 20B away from the substrate 01 may not be disposed with any structure that changes the light-emitting path. Therefore, the light emitted by the second light-emitting part 20B can freely exit according to its own performance, and the light finally emitted from the light-emitting surface of the light-emitting panel 000 may be divergent large-angle light. Furthermore, in the second light-emitting mode, the light-emitting element 20 may emit light in a wide viewing angle range including the collimated light LT1 and large-angle light LT2. Simple drive sequence may realize free switching effect of the light-emitting panel 000 between wide and narrow viewing angles, which may also be beneficial for improving the light-emitting brightness and effect of the light-emitting panel 000 in the second light-emitting mode with a wide viewing angle.

Optionally, referring to FIGS. 1, 4, 6, 12-14 and 18, FIG. 18 illustrates a working time sequence diagram of a pixel circuit in FIG. 14 in the first light-emitting mode and the second light-emitting mode. In one embodiment, the working stages of the pixel circuit 10 may include at least a reset stage T1, a threshold compensation and data write stage T2, and a light-emitting stage T3. At the reset stage T1, the pixel circuit 10 may reset entire circuit to avoid the influence of previous frame display image on next frame display image; at the threshold compensation and data write stage T2, the pixel circuit 10 may perform threshold compensation and writing of data drive signals to the drive transistor (not shown in drawings) included in the pixel circuit; and at the light-emitting stage T3, the pixel circuit 10 may generate a drive current, and the drive current may be transmitted through the light-emitting element 20, so that the light-emitting element 20 may emit light. Optionally, the pixel circuit 10 may include a first scan signal line (not shown in drawings) for controlling the progress of the reset stage T1, and the first scan signal line may be configured to provide a third scan signal scan3 to control the progress of the reset stage T1. The pixel circuit 10 may include a second scan signal line (not shown in drawings) for controlling the threshold compensation and data write stage T2, and the second scan signal line may be configured to provide a fourth scan signal scan4 to control the progress of the threshold compensation and data write stage T2. The pixel circuit 10 may include a light-emitting control signal line (not shown in drawings) for controlling the progress of the light-emitting stage T3, and the light-emitting control signal line may be configured to provide a light-emitting control signal EMIT to control the progress of the light-emitting stage T3. It may be understood that specific structure and working principle of the pixel circuit 10 may not be described in detail in one embodiment, which may be understood by referring to the structure and working principle of the pixel circuit included in the light-emitting panel in the existing technology during an implementation. In one embodiment, it may configure that in the first light-emitting mode A1, at the working stages of the pixel circuit 10 (including the reset stage T1, the threshold compensation and data write stage T2, and the light-emitting stage T3), the first control transistor M1 may be in conduction, the first control transistor M1 may be in cutoff, and the pixel circuit 10 may control only the first light-emitting part 20A of the light-emitting element 20 to emit light; and in the second light-emitting mode A2, at the working stages of the pixel circuit 10 (including the reset stage T1, the threshold compensation and data write stage T2, and the light-emitting stage T3), the first control transistor M1 may be in conduction, the second control transistor M2 may be in conduction, and the pixel circuit 10 may control both the first light-emitting part 20A and the second light-emitting part 20B of the light-emitting element 20 to emit light, thereby realizing switching between wide and narrow viewing angles of two light-emitting modes.

In some optional embodiments, referring to FIGS. 1, 4, 6, 12-14 and 19, FIG. 19 illustrates another working time sequence diagram of a pixel circuit in FIG. 14 in the first light-emitting mode and the second light-emitting mode. In one embodiment, the working stages of the pixel circuit 10 may at least include the reset stage T1, the threshold compensation and data write stage T2, and the light-emitting stage T3.

In the first light-emitting mode A1, at the light-emitting stage T3 of the pixel circuit 10, the first control transistor M1 may be in conduction, and the first control transistor M1 may be in cutoff in other working stages of the pixel circuit 10 (such as the reset stage T1, and the threshold compensation and data write stage T2).

In the second light-emitting mode A2, at the light-emitting stage T3 of the pixel circuit 10, the first control transistor M1 may be in conduction, and the second control transistor M2 may be in conduction; and in other working stages of the pixel circuit 10 (such as the reset stage T1, and the threshold compensation and the data write stage T2), the first control transistor M1 may be in cutoff, and the second control transistor M2 may be in cutoff.

In one embodiment, it describes that the working stages of the pixel circuit 10 may include at least the reset stage T1, the threshold compensation and data write stage T2, and the light-emitting stage T3. Optionally, the pixel circuit 10 may include the first scan signal line (not shown in drawings) for controlling the progress of the reset stage T1, and the first scan signal line may be configured to provide the third scan signal scan3 to control the progress of the reset stage T1; the pixel circuit 10 may include the second scan signal line (not shown in drawings) for controlling the threshold compensation and data write stage T2, the second scan signal line may be configured to provide the fourth scan signal scan4 to control the progress of the threshold compensation and data write stage T2; and the pixel circuit 10 may include the light-emitting control signal line (not shown in drawings) for controlling the progress of the light-emitting stage T3, and the light-emitting control signal line may be configured to provide the light-emitting control signal EMIT to control the progress of the light-emitting stage T3. At the reset stage T1, the pixel circuit 10 may reset entire circuit to avoid the influence of previous frame display image on next frame display image; at the threshold compensation and data write stage T2, the pixel circuit 10 may perform threshold compensation and writing of data drive signals to the drive transistor (not shown in drawings) included in the pixel circuit; and at the light-emitting stage T3, the pixel circuit 10 may generate a drive current, and the drive current may be transmitted through the light-emitting element 20, so that the light-emitting element 20 may emit light. It may be understood that specific structure and working principle of the pixel circuit 10 may not be described in detail in one embodiment, which may be understood by referring to the structure and working principle of the pixel circuit included in the light-emitting panel in the existing technology during an implementation.

In one embodiment, it describes that in the first light-emitting mode A1, at the light-emitting stage T3 of the pixel circuit 10, the first control transistor M1 may be in conduction; and in remaining working stages of the pixel circuit 10 (such as the reset stage T1, threshold compensation and data write stage T2), the first control transistor M1 may be in cutoff. That is, the first control transistor M1 may only be in conduction when the pixel circuit 10 works at the light-emitting stage T3 and may be in cutoff at other working stages of the pixel circuit 10. Only at the light-emitting stage T3 of the first light-emitting mode A1, the pixel circuit 10 may control the first light-emitting part 20A of the light-emitting element 20 to emit light, which may be beneficial for saving power consumption of the pixel circuit 10 working in the first light-emitting mode A1. In the second light-emitting mode A2, at the light-emitting stage T3 of the pixel circuit 10, the first control transistor M1 may be in conduction, the second control transistor M2 may be in conduction; and in remaining working stages of the pixel circuit 10 (such as the reset stage T1, threshold compensation and data write stage T2), the first control transistor M1 may be in cutoff, and the second control transistor M2 may be in cutoff. That is, the first control transistor M1 and the second control transistor M2 may only be in conduction when the pixel circuit 10 works at the light-emitting stage T3 and may be in cutoff at other working stages of the pixel circuit 10. Only at the light-emitting stage T3 in the second light-emitting mode A2, the pixel circuit 10 may control both the first light-emitting part 20A and the second light-emitting part 20B of the light-emitting element 20 to emit light, which may be beneficial for saving the power consumption of the pixel circuit 10 working in the second light-emitting mode A2. Furthermore, the switching of a wide and narrow viewing angles of two light-emitting modes may be realized by separately controlling the first control transistor M1 and the second control transistor M2.

Figure 21:
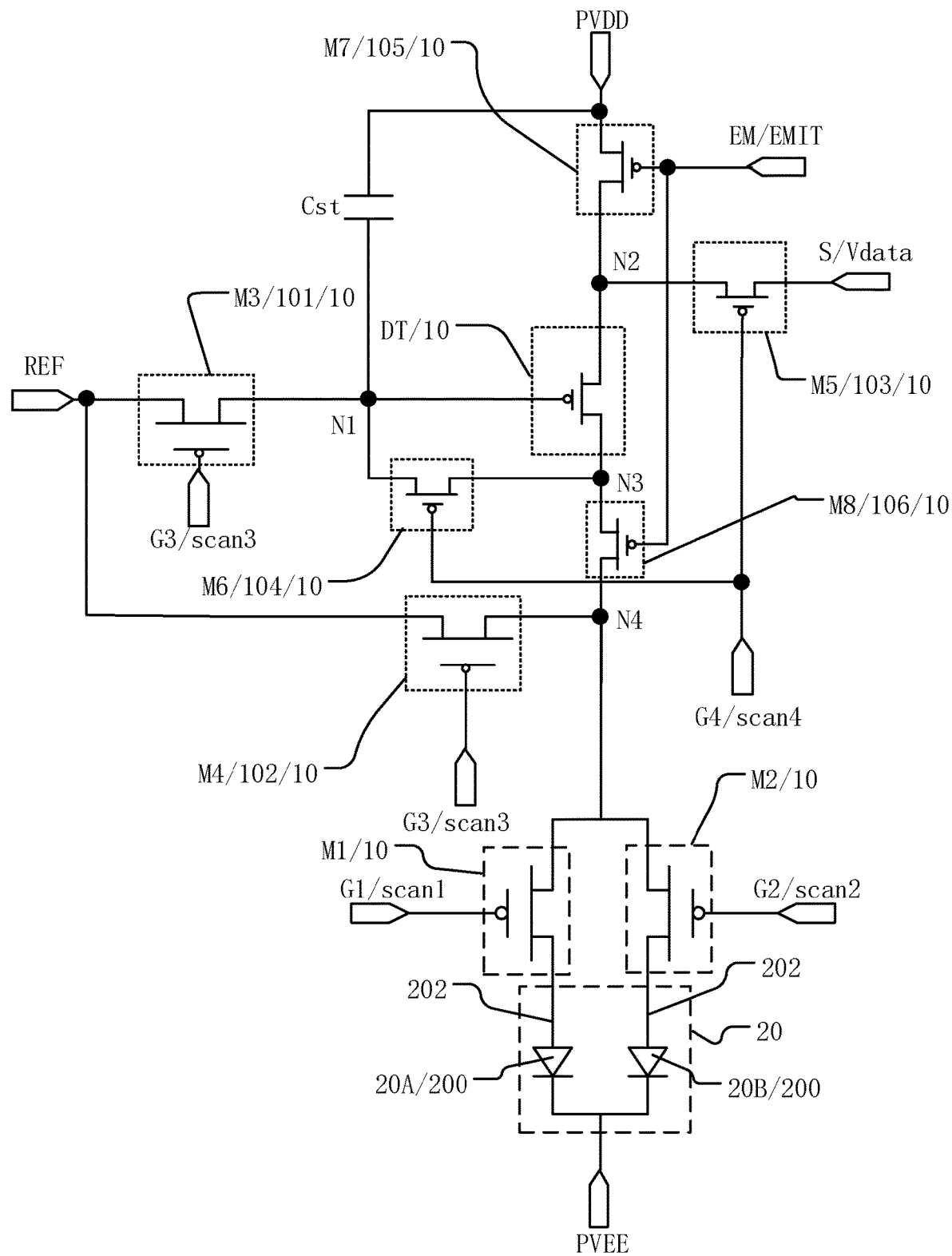
FIG. 21 illustrates an electrical connection structural schematic of a pixel circuit in FIG. 20.
Figure 22:
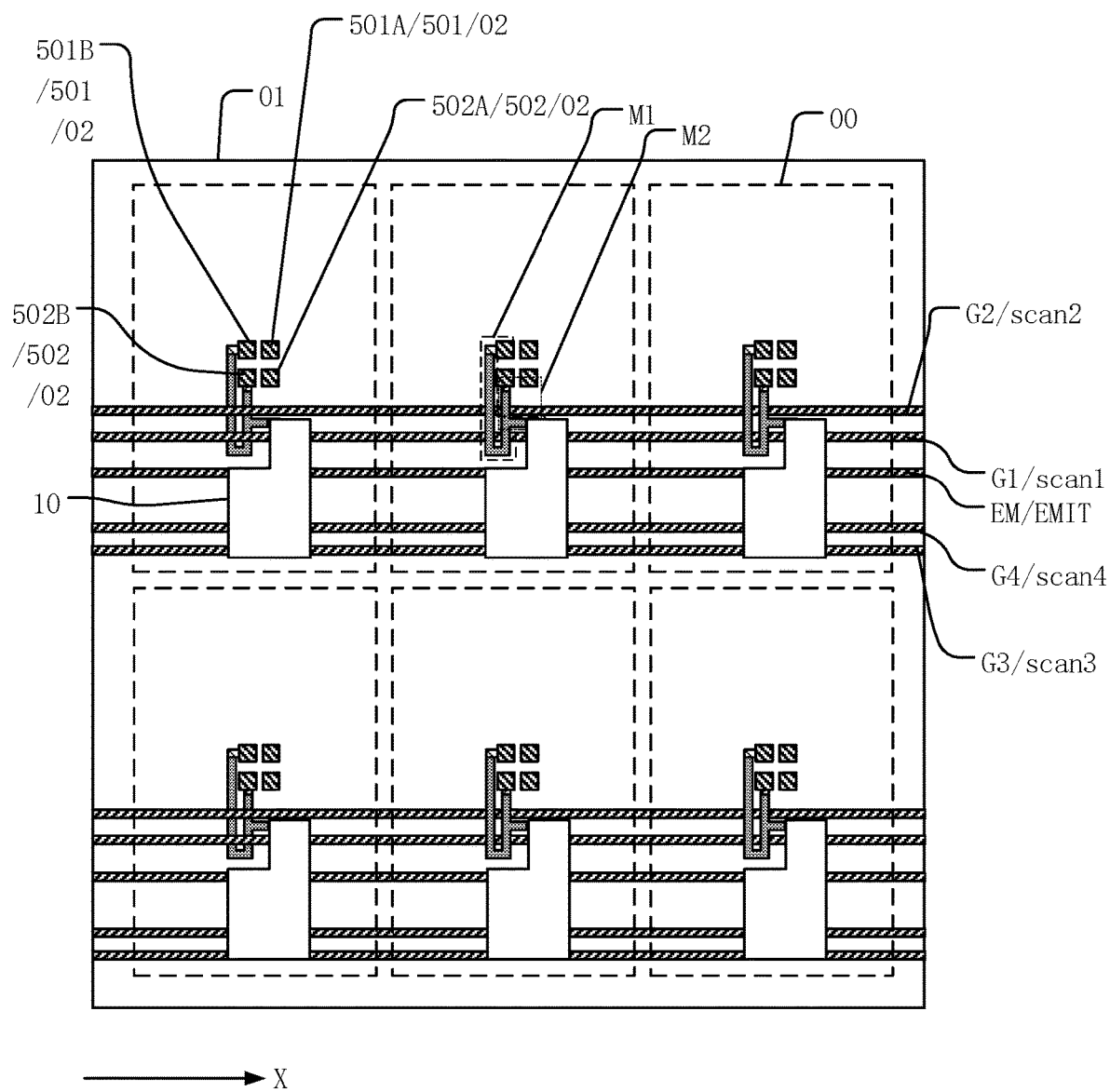
FIG. 22 illustrates another planar structural view of a partial structure of a light-emitting unit in a local region on a substrate in FIG. 1.

In some optional embodiments, referring to FIGS. 1, 4, 6 and 19-22, FIG. 20 illustrates another electrical connection structural schematic of a light-emitting unit in FIG. 1; FIG. 21 illustrates an electrical connection structural schematic of a pixel circuit in FIG. 20; and FIG. 22 illustrates another planar structural view of a partial structure of a light-emitting unit in a local region on the substrate in FIG. 1. It may be understood that, in order to clearly illustrate the structure in one embodiment, transparency filling is performed in FIG. 22. In one embodiment, the pixel circuit 10 may include a first reset module 101, a second reset module 102, a drive transistor DT, a threshold compensation module 103, a data write module 104, a first light-emitting control module 105 and a second light-emitting control module 106.

The control terminal of the first reset module 101 may be connected to the first scan signal line G3; the first terminal of the first reset module 101 may be connected to the reference voltage signal line REF; and the second terminal of the first reset module 101 may be connected to the gate electrode of the drive transistor DT.

The control terminal of the second reset module 102 may be connected to the first scan signal line G3, the first terminal of the second reset module 102 may be connected to the reference voltage signal line REF, the second terminal of the second reset module 102 may be connected to the second electrode of the first control transistor M1, and the second terminal of the second reset module 102 may be connected to the second electrode of the second control transistor M2.

The control terminal of the data write module 103 may be connected to the second scan signal line G4, the first terminal of the data write module 103 may be connected to the data line S, and the second terminal of the data write module 103 may be connected to the first electrode of the drive transistor DT.

The control terminal of the threshold compensation module 104 may be connected to the second scan signal line G4, the first terminal of the threshold compensation module 104 may be connected to the gate electrode of the drive transistor DT, and the second terminal of the threshold compensation module 104 may be connected to the second electrode of the drive transistor DT.

The control terminal of the first light-emitting control module 105 may be connected to the light-emitting control signal line EM, the first terminal of the first light-emitting control module 105 may be connected to the first power signal line PVDD, and the second terminal of the first lighting control module 105 may be connected to the first electrode of the drive transistor DT.

The control terminal of the second light-emitting control module 106 may be connected to the light-emitting control signal line EM, the first terminal of the second light-emitting control module 106 may be connected to the second electrode of the drive transistor DT, and the second terminal of the second lighting control module 106 may be connected to the second power signal line PVEE.

The extension directions of the first control signal line G1, the second control signal line G2, the first scan signal line G3 and the second scan signal line G4 are same.

In one embodiment, it configures that the extension directions of the first control signal line G1 for controlling whether the first control transistor M1 is in conduction, the second control signal line G2 for controlling whether the second control transistor M2 is in conduction, the first scan signal line G3 for controlling whether the first reset module 101 and the second reset module 102 are in conduction, and the second scan signal line G4 for controlling whether the data write module 103 and the threshold compensation module 104 are in conduction may be same, that is, above-mentioned lines may all extend along the second direction X in FIG. 22 and be used as scan drive signal lines.

In one embodiment, it describes that the electrical connection structure of the pixel circuit 10 may include the first reset module 101, the second reset module 102, the drive transistor DT, the threshold compensation module 103, the data write module 104, the first light-emitting control module 105 and the second light-emitting control module 106.

The control terminal of the first reset module 101 may be connected to the first scan signal line G3, and the first scan signal line G3 may be configured to provide the third scan signal scan3 that makes the first terminal and the second terminal of the first reset module 101 to be in conduction. In such way, the reference voltage signal provided by the reference voltage signal line REF connected to the first terminal of the first reset module 101 may be provided to the gate electrode of the drive transistor DT connected to the second terminal of the first reset module 101, thereby resetting the gate electrode of the drive transistor DT at the reset stage T1. Optionally, the first reset module 101 may include the third transistor M3. The gate electrode of the third transistor M3 may be configured as the control terminal of the first reset module 101, which is connected to the first scan signal line G3; the first electrode of the third transistor M3 may be configured as the first electrode of the first reset module 101, which is connected to the reference voltage signal line REF; and the second electrode of the third transistor M3 may be configured as the second terminal of the first reset module 101, which is connected to the gate electrode of the drive transistor DT. When the third transistor M3 is a P-type transistor, under the control of the low-potential third scan signal scan3 provided by the first scan signal line G3, the first electrode and the second electrode of the third transistor M3 may be in conduction; and the reference voltage signal provided by the reference voltage signal line REF may be provided to the gate electrode of the drive transistor DT to reset the drive transistor DT, thereby being beneficial for conduction of the drive transistor DT after completing the reset operation.

The control terminal of the second reset module 102 may be connected to the first scan signal line G3, and the first scan signal line G3 may be configured to provide the third scan signal scan3 that makes the first terminal and the second terminal of the second reset module 102 to be in conduction. Therefore, the reference voltage signal provided by the reference voltage signal line REF connected to the first terminal of the second reset module 102 may be provided to the second electrode of the first control transistor M1 which is connected to the second electrode of the second reset module 102, such that the reference voltage signal provided by the reference voltage signal line REF connected to the first terminal of the second reset module 102 may be provided to the second electrode of the second control transistor M2 which is connected to the second electrode of the second reset module 102, thereby resetting the anode of the light-emitting element 20 at the reset stage T1. Optionally, the second reset module 102 may include a fourth transistor M4. The gate electrode of the fourth transistor M4 may be configured as the control terminal of the second reset module 102, which is connected to the first scan signal line G3, the first electrode of the fourth transistor M4 may be configured as the first electrode of the second reset module 102, which is connected to the reference voltage signal line REF, and the second electrode of the fourth transistor M4 may be configured as the second terminal of the second reset module 102, which is connected to the second electrode of the first control transistor M1 and the second electrode of the second control transistor M2. When the fourth transistor M4 is a P-type transistor, under the control of the low-potential third scan signal scan3 provided by the first scan signal line G3, the first electrode and the second electrode of the fourth transistor M4 may be in conduction, and the reference voltage signal provided by the reference voltage signal line REF may be provided to the anode of the light-emitting element 20 to reset the light-emitting element 20, so that the anode of the light-emitting element 20 may be initialized. Therefore, during the display process, display signal residue of previous frame may be improved, and afterimage phenomenon and the display effect may be improved.

The control terminal of the threshold compensation module 104 may be connected to the second scan signal line G4. The second scan signal line G4 may be configured to provide the fourth scan signal scan4 which may make the first terminal and the second terminal of the threshold compensation module 104 to be in conduction. In such way, the gate electrode of the drive transistor DT connected to the first terminal of the threshold compensation module 104 and the second electrode of the drive transistor DT connected to the second terminal of the threshold compensation module 104 may be in conduction. The control terminal of the data write module 103 may be connected to the second scan signal line G4. The second scan signal line G4 may be configured to provide the fourth scan signal scan4 which may make the first terminal and the second terminal of the data write module 103 to be in conduction. In such way, the data drive signal after threshold compensation provided by the data line S connected to the first terminal of the data write module 103 may be provided to the first electrode of the drive transistor DT connected to the second terminal of the data write module 103; and at the threshold compensation and data write stage T2, the data drive signal after threshold compensation may be written into the pixel circuit 10. Optionally, the data write module 103 may include a fifth transistor M5, and the threshold compensation module 104 may include a sixth transistor M6. The gate electrode of the sixth transistor M6 may be connected to the second scan signal line G4 as the control terminal of the threshold compensation module 104, the first electrode of the sixth transistor M6 may be connected to the gate electrode of the drive transistor DT as the first electrode of the threshold compensation module 104, and the second electrode of the sixth transistor M6 may be connected to the second electrode of the drive transistor DT as the second electrode of the threshold compensation module 104. When the sixth transistor M6 is a P-type transistor, under the control of the low-potential fourth scan signal scan4 provided by the second scan signal line G4, the first electrode and the second electrode of the sixth transistor M6 may be in conduction, the gate electrode of the fifth transistor M5 may be connected to the second scan signal line G4 as the control terminal of the data write module 103, the first electrode of the fifth transistor M5 may be connected to the data line S as the first terminal of the data write module 103, and the second electrode of the fifth transistor M5 may be connected to the first electrode of the drive transistor DT as the second terminal of the data write module 103. When the fifth transistor M5 is a P-type transistor, under the control of the low-potential fourth scan signal scan4 provided by the second scan signal line G4, the first electrode and the second electrode of the fifth transistor M5 may be in conduction. At the threshold compensation and data write stage T2, the data drive signal after threshold compensation provided by the data line S may be provided to the first electrode of the drive transistor DT as the data drive signal after threshold compensation written into the drive transistor DT.

The control terminal of the first light-emitting control module 105 may be connected to the light-emitting control signal line EM, and the light-emitting control signal line EM may be configured to provide the light-emitting control signal EMIT which may make the first terminal and the second terminal of the first light-emitting control module 105 to be in conduction, such that the first power signal on the first power signal line PVDD connected to the first terminal of the first light-emitting control module 105 may be provided to the first electrode of the drive transistor DT connected to the second terminal of the first light-emitting control module 105. The control terminal of the second light-emitting control module 106 may be connected to the light-emitting control signal line EM, and the light-emitting control signal line EM may be configured to provide the light-emitting control signal EMIT which may make the first terminal and the second terminal of the second light-emitting control module 106 to be in conduction, such that a conductive path may be formed between the second electrode of the drive transistor DT connected to the first terminal of the second light-emitting control module 106 and the second power signal line PVEE connected to the second terminal of the second light-emitting control module 106. Finally, at the light-emitting stage T3, a conductive path may be formed among the first power signal line PVDD, the first light-emitting control module 105, the drive transistor DT, the second light-emitting control module 106, the first control transistor M1, the second control transistor M2, and the second power signal line PVEE, which may provide the drive current to the light-emitting element 20 and drive the light-emitting element 20 to emit light. Optionally, the first light-emitting control module 105 may include a first transistor M7, and the second light-emitting control module 106 may include a second transistor M8. The gate electrode of the first transistor M7 may be configured as the control terminal of the first light-emitting control module 105 which is connected to the light-emitting control signal line EM, the first electrode of the first transistor M7 may be configured as the first terminal of the first light-emitting control module 105 which is connected to the first power signal line PVDD, and the second electrode of the first transistor M7 may be configured as the second electrode of the first lighting control module 105 which is connected to the first electrode of the drive transistor DT. When the first transistor M7 is a P-type transistor, under the control of the low-potential light-emitting control signal EMIT provided by the light-emitting control signal line EM, the first electrode and the second electrode of the first transistor M7 may be in conduction, and the first power signal on the first power signal line PVDD may be provided to the first electrode of the drive transistor DT. The gate electrode of the second transistor M8 may be configured as the control terminal of the second light-emitting control module 106 which is connected to the light-emitting control signal line EM, the first electrode of the second transistor M8 may be configured as the first terminal of the second light-emitting control module 106 which is connected to the second electrode of the drive transistor DT, and the second electrode of the second transistor M8 may be configured as the second terminal of the second lighting control module 106 which is connected to the second power signal line PVEE. When the second transistor M8 is a P-type transistor, under the control of the low-potential light-emitting control signal EMIT provided by the light-emitting control signal line EM, the first electrode and the second electrode of the second transistor M8 may be in conduction, a conductive path may be formed between the second electrode of the drive transistor DT and the second power signal line PVEE, and a conductive path may be formed among the first power signal line PVDD, the first transistor M7, the drive transistor DT, the second transistor M8, the first control transistor M1, the second control transistor M2, and the second power signal line PVEE, which may provide a drive current for the light-emitting element 20 and drive the light-emitting element 20 to emit light at the light-emitting stage T3.

Optionally, the pixel circuit 10 in one embodiment may further include a storage capacitor Cst, one terminal of the storage capacitor Cst may be connected to the first power signal line PVDD, and the other terminal of the storage capacitor Cst may be connected to the gate electrode of the drive transistor DT. Optionally, the storage capacitor Cst may be configured to stabilize the potential of the gate electrode of the drive transistor DT, which is beneficial for maintaining the drive transistor DT to be in conduction.

In one embodiment, it describes the circuit connection structure included in the pixel circuit 10 of the display panel 000. The pixel circuit 10 may include a plurality of transistors and one storage capacitor Cst, where one transistor may be a drive transistor DT, and another transistor may be a switch transistor. In one embodiment, taking the structure in which the pixel circuit 10 is electrically connected to the light-emitting element 20 shown in FIG. 11 as an example, the gate electrode of the drive transistor DT represents the first node N1, the first electrode of the drive transistor DT represents the second node N2, the second electrode of the drive transistor DT represents the third node N3, and the anode of the light-emitting element 20 represents the fourth node N4. The working principle of the pixel circuit 10 is described hereinafter.

At the reset stage T1, the third transistor M3 and the fourth transistor M4 may be in conduction, other transistors may be in cutoff, the potential of the first node N1 may be the reference voltage signal provided by the reference voltage signal line REF, and the potential of the fourth node N4 may be the reference voltage signal provided by the reference voltage signal line REF, which may drive the gate electrode of the transistor DT and the anode of the light-emitting element 20 to reset.

At the threshold compensation and data write stage T2, the fifth transistor M5 and the sixth transistor M6 may be in conduction, the drive transistor DT may be in conduction, other transistors may be in cut-off, the potential of the second node N2 may be the data drive signal Vdata provided by the data line, and the potential of the first node N1 and the third node N3 may be Vdata−|Vth|, where Vth may be the threshold voltage of the drive transistor DT.

At the light-emitting stage T3 of the first light-emitting mode A1, the first transistor M7, the second transistor M8, and the drive transistor DT may be in conduction, the first control transistor M1 may be in conduction, and other transistors may be in cut-off. The first power signal Vpvdd of the first power signal line PVDD may be transmitted to the drive transistor DT, and the drive transistor DT may generate a drive current to drive the light-emitting element 20 to emit light. At this point, only the first light-emitting part 20A of the light-emitting element 20 may emit light, and the light-emitting panel 000 may be in the first light-emitting mode A1 with a narrow viewing angle.

At the light-emitting stage T3 of the second light-emitting mode A2, the first transistor M7, the second transistor M8, and the drive transistor DT may be in conduction, the first control transistor M1 may be in conduction, the second control transistor M2 may be in conduction, and other transistors may be in cut-off. The first power signal Vpvdd of the first power signal line PVDD may be transmitted to the drive transistor DT, and the drive transistor DT may generate a drive current to drive the light-emitting element 20 to emit light. At this point, both the first light-emitting part 20A and the second light-emitting part 20B of the light-emitting element 20 may emit light, and the light-emitting panel 000 may be in the second light-emitting mode A2 with a wide viewing angle. Whether the panel is in the light-emitting stage T3 of the first light-emitting mode A1 or in the light-emitting stage T3 of the second light-emitting mode A2, at this point, the potential of the second node N2 may be the first power signal Vpvdd, the potential of the first node N1 may be Vdata−|Vth|, and the potential of the third node N3 may be Vpvee+Vo. Vpvee may be the second power signal provided by the second power signal line PVEE, which may be a negative potential, and Vo may be corresponding voltage on the light-emitting element 20, then the light-emitting current $Id=k(Vgs-|Vth|)^2=k(Vpvdd-Vdata-|Vth|)^2$, where the constant k is related to the performance of the drive transistor DT itself.

It should be noted that, in one embodiment, the transistors included in the pixel circuit 10 are P-type transistors as an example for description. In some other optional embodiments, a structure of N-type transistors may also be selected, or a structure in which a part of the transistors are N-type transistors, and another part of the transistors are P-type transistors may also be selected. When the transistor is selected as a P-type transistor, the P-type transistor may be in conduction when its gate is at a low potential. That is, when the transistor is selected as an N-type transistor, the N-type transistor may be in conduction when its gate is at a high potential, thereby realizing the conduction of the transistor. During an implementation, the types of the transistors may be set according to actual requirements, which may not be limited in one embodiment.

It may be understood that in one embodiment, when the pixel circuit 10 is fabricated in the film layer structure on the substrate 01, the structures except of the first control transistor M1 and the second control transistor M2 in the pixel circuit 10 are only illustrated as blocks in FIG. 22. The layout structure of other transistors and capacitors included in the pixel circuit 10 on the substrate 01 may be configured with reference to the layout structure in the existing technology, which may not be described in detail in one embodiment.

In some optional embodiments, referring to FIGS. 1, 4, 6 and 19-23, FIG. 23 illustrates another planar structural view of a partial structure of a light-emitting unit in a local region on the substrate in FIG. 1. It may be understood that, in order to clearly illustrate the structure in one embodiment, transparency filling is performed in FIG. 23. In one embodiment, in one light-emitting unit 00, the orthographic projection of the light-emitting element 20 on the substrate 01 and the orthographic projection of the pixel circuit 10 on the substrate 01 may be respectively arranged along the first direction Y.

Along the second direction X, the orthographic projection of the first power signal line PVDD on the substrate 01 and the orthographic projection of the second power signal line PVEE on the substrate 01 may be respectively on two opposite sides of the light-emitting element 20, where the second direction X may be same as the extension direction of the first scan signal line G3, and the first direction Y may intersect the second direction X. Optionally, in one embodiment, the first direction Y and the second direction X may be perpendicular to each other along the direction parallel to the plane where the substrate 01 is located, which is taken as an example for description.

In one embodiment, it describes that in the region of one light-emitting unit 00, the layout structure of the pixel circuit 10 and the light-emitting element 20 included in the light-emitting unit 00 may be that the orthographic projection of the light-emitting element 20 on the substrate 01 and the orthographic projection of the pixel circuit 10 on the substrate 01 may be respectively arranged along the first direction Y. Optionally, the orthographic projection of the light-emitting element 20 on the substrate 01 and the orthographic projection of the plurality of transistor structures included in the pixel circuit 10 on the substrate 01 may be respectively arranged along the first direction Y. Therefore, the left and right sides of the light-emitting element 20 and the transistor structure included in the pixel circuit 10 along the second direction X in the region of one light-emitting unit 00 may be configured to disposed with the signal lines connected to the pixel circuit 10. For example, in one embodiment, after the orthographic projection of the light-emitting element 20 on the substrate 01 and the orthographic projection of the plurality of transistor structures included in the pixel circuit 10 on the substrate 01 are configured to be respectively arranged along the first direction Y, the orthographic projection of the first power signal line PVDD on the substrate 01 and the orthographic projection of the second power signal line PVEE on the substrate 01 may be configured to respectively on two opposite sides of the light-emitting element 20 along the second direction X. Therefore, more space may be reserved in the region where each light-emitting unit 00 is located to dispose the first power signal line PVDD and the second power signal line PVEE, which may be beneficial for making the width of the first power signal line PVDD along the second direction X and the width of the second power signal line PVEE along the second direction X as wide as possible. Furthermore, the resistance of the power signal line may be effectively reduced, which may avoid the problem that the IR drop (I denotes current, R denotes resistance) or voltage drop of the first power signal line PVDD and the second power signal line PVEE of the long wire structure in the light-emitting panel 000 may be excessively large to cause excessive signal attenuation, which may be further beneficial for improving IR drop.

Figure 23:
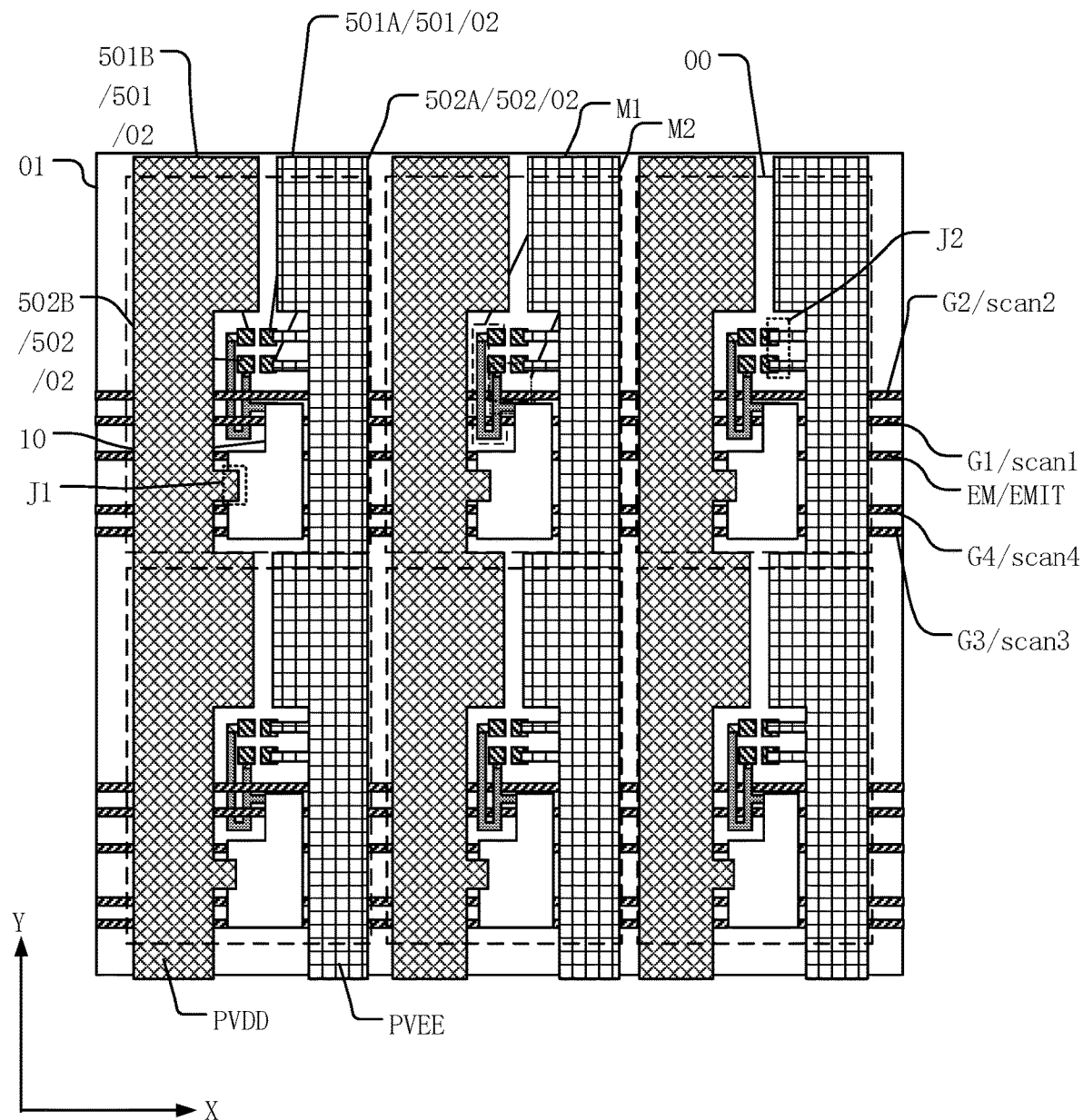
FIG. 23 illustrates another planar structural view of a partial structure of a light-emitting unit in a local region on a substrate in FIG. 1.

It may be understood that overall extension direction of the first power signal line PVDD in one embodiment may be the first direction Y; and in each light-emitting unit 00, the first power signal line PVDD may be connected to the first terminal of the first light-emitting control module 105 in the pixel circuit 10. Other transistor structures of the pixel circuit 10 in FIG. 23 are not illustrated except for the first control transistor M1 and the second control transistor M2, such that FIG. 23 only illustrates the position J1 of the electrical connection between the first power signal line PVDD and the pixel circuit 10. During an implementation, the position of the electrical connection between the first power signal line PVDD and the pixel circuit 10 may be configured according to the arrangement positions of the transistors of the first light-emitting control module 105 in the pixel circuit 10. When the first power signal line PVDD and the structure of the first terminal of the first light-emitting control module 105 are arranged in different layers, it needs to consider realizing the electrical connection through vias, which may not be described in one embodiment. In one embodiment, overall extension direction of the second power signal line PVEE may be the first direction Y. In each light-emitting unit 00, the second power signal line PVEE may need to be connected to the first soldering pad 501A of the first soldering pad group 501 and the third soldering pad 502A of the second soldering pad group 502 which are bound to the cathode 201 of the light-emitting element 20 in the pixel circuit 10. As shown in FIG. 23, when the Y light-emitting element 20 is arranged on a side of the transistor structure included in the pixel circuit 10 along the first direction, the position J2 of the electrical connection between the second power signal line PVEE and the cathode 201 of the light-emitting element 20 in the pixel circuit 10 is shown in FIG. 23. During an implementation, when the second power signal line PVEE and the soldering pad layer are arranged in different layers, it needs to consider realizing the electrical connection through vias, which may not be described in detail in one embodiment.

In some optional embodiments, referring to FIGS. 1, 4, 6 and 19-25, FIG. 24 illustrates a planar layout schematic of a drive transistor of the pixel circuit on the substrate in FIG.

Figure 24:
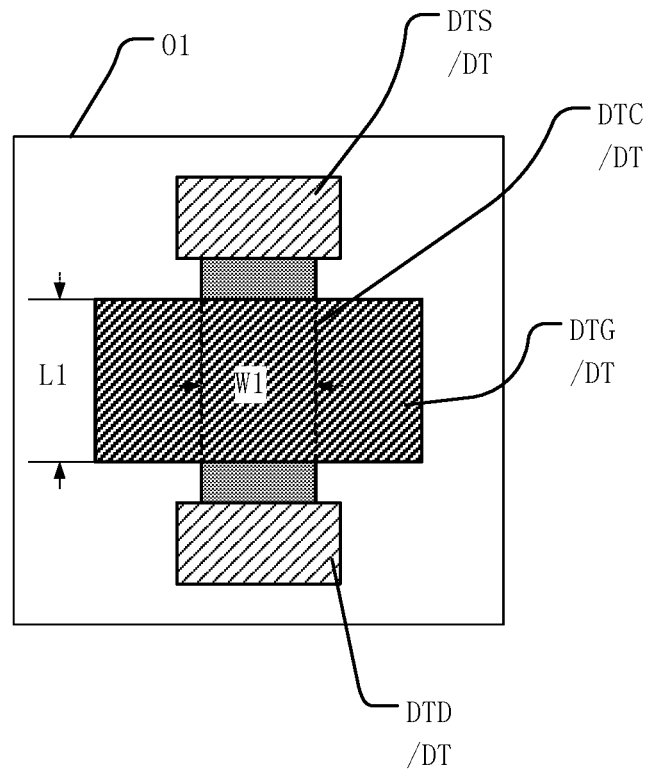
FIG. 24 illustrates a planar layout schematic of a drive transistor of a pixel circuit on a substrate in FIG. 21.
Figure 25:
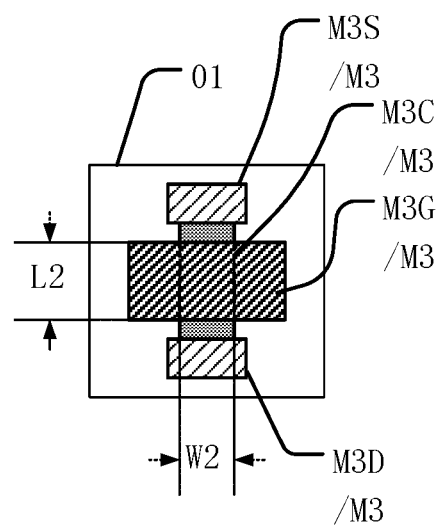
FIG. 25 illustrates a planar layout schematic of another drive transistor of a pixel circuit on a substrate in FIG. 21.

21; and FIG. 25 illustrates a planar layout schematic of another drive transistor of the pixel circuit on the substrate in FIG. 21. It may be understood that in order to clearly illustrate the structure in one embodiment, transparency filling is performed in FIGS. 24-25. In one embodiment, the pixel circuit 10 may include the plurality of transistors, where the first light-emitting control module 105 may include the first transistor M7, and the second light-emitting control module 106 may include the second transistor M8.

The width-to-length ratio W1/L1 of each of the first transistor M7, the second transistor M8 and the drive transistor DT may be greater than the width-to-length ratios W2/L2 of other transistors in the pixel circuit 10.

In one embodiment, it describes that compared with the drive current of light-emitting elements such as organic light-emitting diodes (usually at the level of tens of nanoampere nA), the drive current of micro-light-emitting elements such as micro LED/mini-LED may be at the level of microampere (uA) and milliampere Level (mA), that is, the micro LED light-emitting panel may have high current characteristics. The light-emitting panel 000 in one embodiment may consume a larger amount of current in operation. The OLED light-emitting panel may consume operating current of about nanoampere (nA), while the micro-LED light-emitting panel may need to consume operating current of about microampere or milliampere level, which needs a greater drive capability. Therefore, in one embodiment, the magnitude of the signal for driving the micro-light-emitting element 20 to emit light may be adjusted by modifying the width-to-length ratio of the drive transistor DT. Optionally, in the electrical connection structure of the pixel circuit 10, although the pixel circuit 10 includes the plurality of transistors, the first transistor M7 included in the first light-emitting control module 105, the second transistor M8 included in the second light-emitting control module 106, and the drive transistor DT may be the transistors that need to pass through the drive current on the conduction path of the light-emitting element 20. However, the light-emitting element 20 in one embodiment is a micro-light-emitting element, which needs a relatively high level of drive current, while remaining transistors are transistors on each branch of the pixel circuit 10 which may not need a relatively large drive current. Therefore, in one embodiment, the width-to-length ratio of the first transistor M7, the width-to-length ratio of the second transistor M8, and the width-to-length ratio W1/L1 of the drive transistor DT may be configured to be greater than the width-to-length ratios W2/L2 of other transistors in the pixel circuit 10. Furthermore, optionally, the width-to-length ratio of the first transistor M7, the width-to-length ratio of the second transistor M8, and the width-to-length ratio of the drive transistor DT may be same or similar; and the width-to-length ratios of other transistors in the pixel circuit 10 may be same or similar. For example, FIG. 24 is the layout of the drive transistor DT on the substrate, and FIG. 25 is planar arrangement layout of any transistor on the substrate except the drive transistor DT, the first transistor M7 and the second transistor M8 of the pixel circuit 10. In one embodiment, the width-to-length ratio of the first transistor M7, the width-to-length ratio of the second transistor M8, and the width-to-length ratio W1/L1 of the drive transistor DT may be configured to be greater than the width-to-length ratios W2/L2 of other transistors in the pixel circuit 10. Therefore, the width-to-length ratio of the first transistor M7, the width-to-length ratio of the second transistor M8, and the width-to-length ratio of the drive transistor DT on the conductive path of the light-emitting element 20 may be relatively large, where the drive current may drive these transistors to emit light. Furthermore, the drive capability of the micro-light-emitting element 20 in one embodiment may be improved, and the light-emitting effect of the light-emitting element 20 may be ensured.

It may be understood that the drive transistor DT may include a first gate DTG, a first source DTS, and a first drain DTD. Along a direction in which the first source DTS points to the first drain DTD, the length of the first channel region DTC of the drive transistor DT is L1; and along a direction perpendicular to the direction in which the first source DTS points to the first drain DTD, the width of the first channel region DTC of the drive transistor DT is W1. Therefore, the width-to-length ratio of the drive transistor DT is the width-to-length ratio W1/L1 of the first channel region DTC of the drive transistor DT. Any other transistor (such as the third transistor M3 in FIG. 21) in the pixel circuit 10 except the drive transistor DT, the first transistor M7 and the second transistor M8 may include a second gate M3G, a second source M3S, a second drain M3D. Along the direction in which the second source M3S points to the second drain M3D, the length of the second channel region M3C of the third transistor M3 is L2; and along a direction perpendicular to the direction in which the second source M3S points to the second drain M3D, the width of the second channel region M3C of the third transistor M3 is W2. Therefore, the width-to-length ratio of the third transistor M3 is the width-to-length ratio W2/L2 of the second channel region M3C of the third transistor M3.

Figure 26:
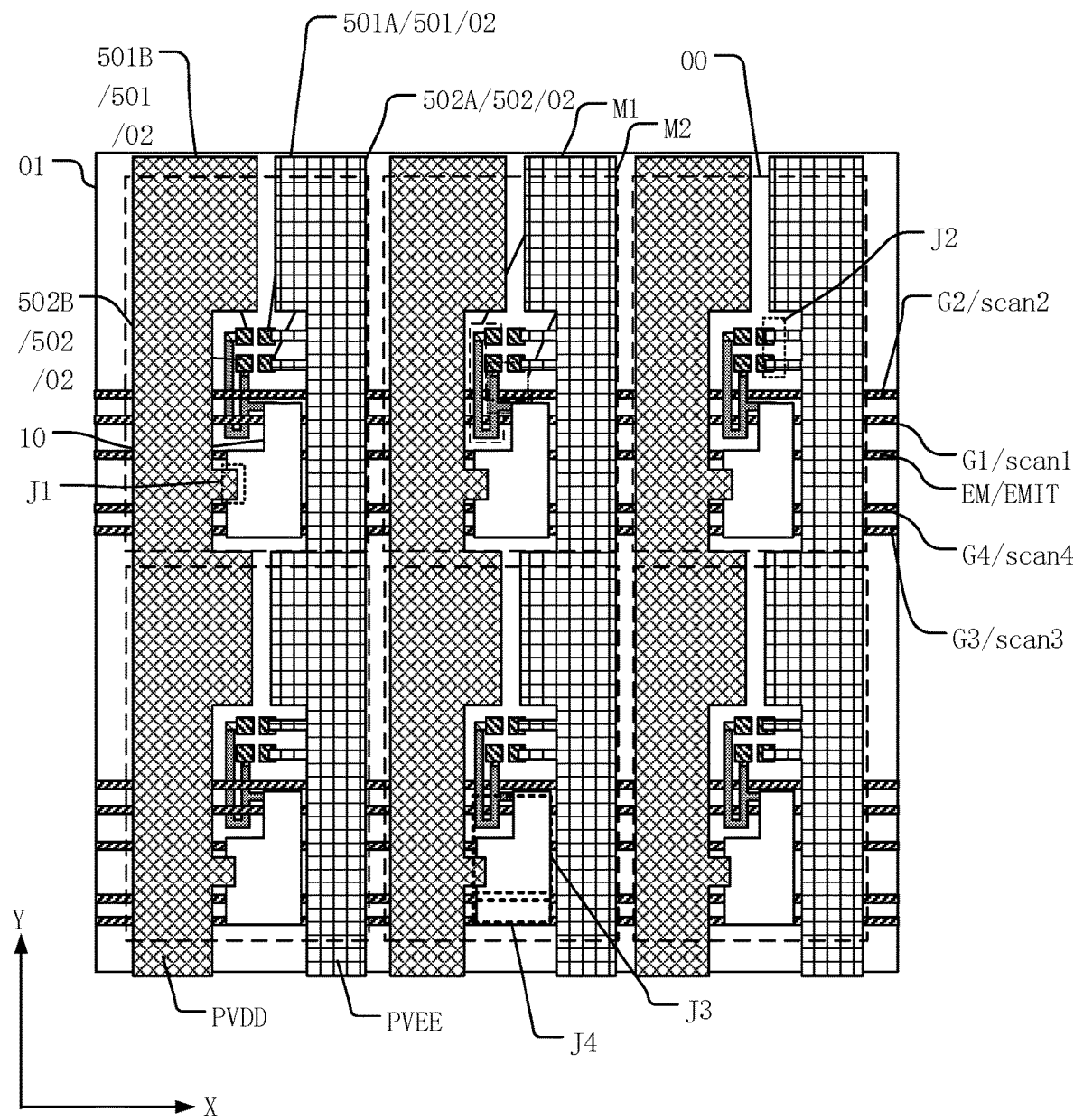
FIG. 26 illustrates another planar structural view of a partial structure of a light-emitting unit in a local region on a substrate in FIG. 1.
Figure 27:
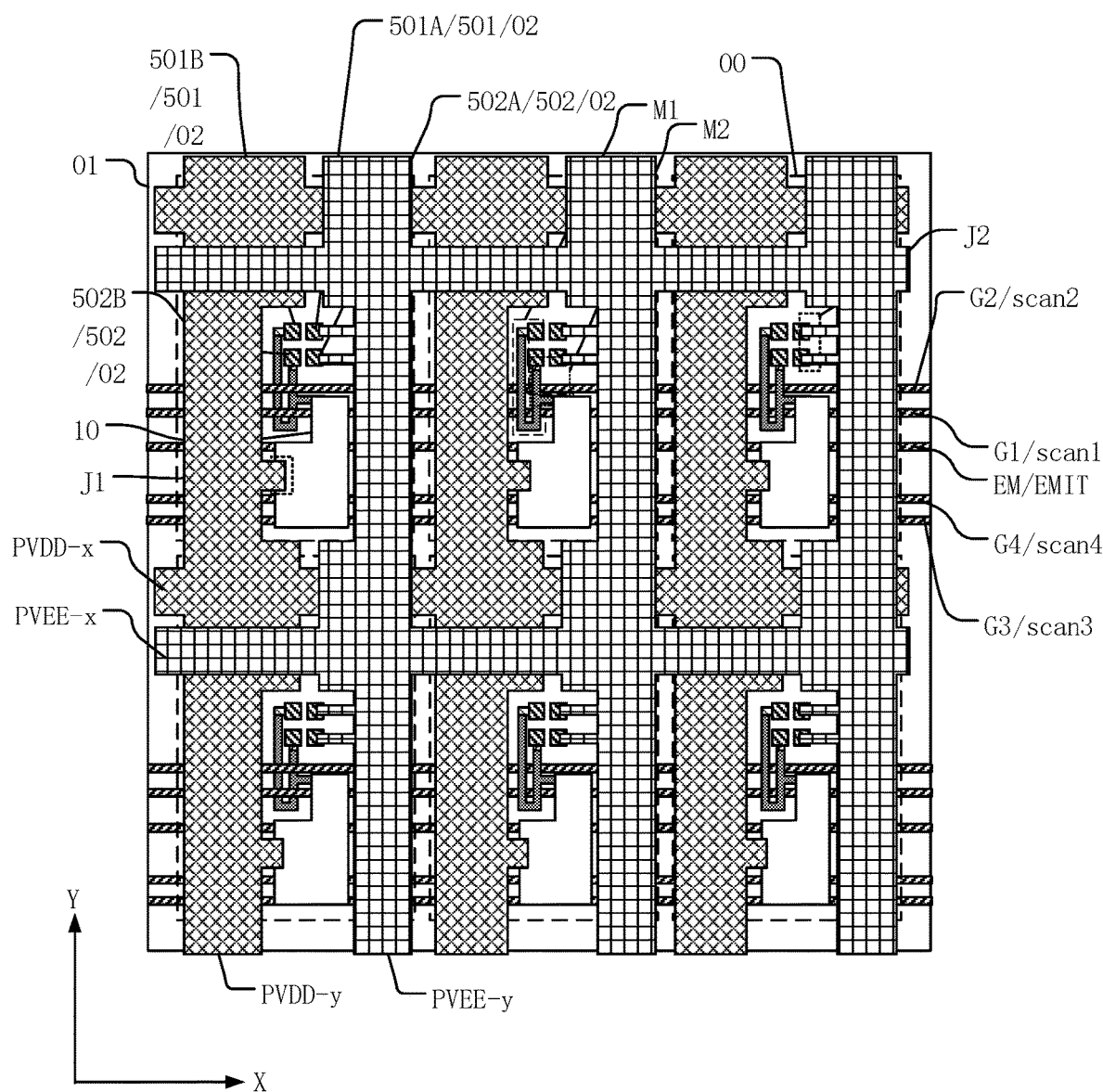
FIG. 27 illustrates another planar structural view of a partial structure of a light-emitting unit in a local region on a substrate in FIG. 1.

It may be understood that, in the light-emitting panel 000 in one embodiment, the width-to-length ratio of the first transistor M7, the width-to-length ratio of the second transistor M8, and the width-to-length ratio W1/L1 of the drive transistor DT may be configured to be greater than the width-to-length ratios W2/L2 of other transistors in the pixel circuit 10, such that overall size of three transistors on the conductive path of the light-emitting element 20 in the pixel circuit 10 may be enlarged, that is, as shown in FIG. 26. FIG. 26 illustrates another planar structural view of a partial structure of a light-emitting unit in a local region on the substrate in FIG. 1. It may be understood that, in order to clearly illustrate the structure in one embodiment, transparency filling is performed in FIG. 26. The area J3 occupied by the first transistor M7, the second transistor M8, and the drive transistor DT in the pixel circuit 10 may be relatively large, while the area J4 occupied by other transistors in the pixel circuit 10 in the pixel circuit 19 may be relatively small, which satisfies that overall size of the first transistor M7, the second transistor M8, and the drive transistor DT may be larger than overall size of other transistors in the pixel circuit 10, and the width-to-length ratio of the first transistor M7, the width-to-length ratio of the second transistor M8, and the width-to-length ratio W1/L1 of the drive transistor DT may be greater than the width-to-length ratios W2/L2 of other transistors in the pixel circuit 10. In one embodiment, the layout structure of each transistor in the pixel circuit 10 in the region where the light-emitting unit 00 is located may not be limited, which may only need to meet above-mentioned width-to-length requirement.

In some optional embodiments, referring to FIGS. 1, 4, 6, 19-21 and 27, FIG. 27 illustrates another planar structural view of a partial structure of a light-emitting unit in a local region on the substrate in FIG. 1. It may be understood that, in order to clearly illustrate the structure in one embodiment, transparency filling is performed in FIG. 27. In one embodiment, the plurality of first power signal lines PVDD may be connected to each other, and the orthographic projection of the plurality of first power signal lines PVDD on the plane where the substrate 01 is located may include a mesh structure.

The plurality of second power signal lines PVEE may be connected to each other, and the orthographic projection of the plurality of second power signal lines PVEE on the plane where the substrate 01 is located may include a mesh structure.

In one embodiment, it describes that the first power signal lines PVDD connected to all pixel circuits 10 in the light-emitting panel 000 may be connected to each other, which may be beneficial for reducing the quantity of signal lines for inputting the first power signal to the first power signal lines PVDD in the frame region of the light-emitting panel 000. Meanwhile, the first power signal lines PVDD correspondingly connected to different light-emitting units 00 may be connected to each other, so that the orthographic projection of the plurality of first power signal lines PVDD on the plane where the substrate 01 is located may be a mesh structure, that is, the orthographic projection of the plurality of first power signal lines PVDD on the plane where the substrate 01 is located may not only include a vertical segment PVDD-y extending along the first direction Y as a whole, but also include a horizontal segment PVDD-x extending along the second direction X as a whole, so that the area occupied by the light-emitting panel 000 after the plurality of first power signal lines PVDD are connected to each other may be relatively large, thereby being beneficial for further reducing the voltage drop of the first power signal lines PVDD. Similarly, the second power signal lines PVEE connected to each pixel circuit 10 in the light-emitting panel 000 may be connected to each other, which may be beneficial for reducing the quantity of signal lines for inputting the second power signal to the second power signal lines PVEE in the frame region of the light-emitting panel 000. Meanwhile, the second power signal lines PVEE correspondingly connected to different light-emitting units 00 may be connected to each other, so that the orthographic projection of the plurality of second power signal lines PVEE on the plane where the substrate 01 is located may be a mesh structure, that is, the orthographic projection of the plurality of second power signal lines PVEE on the plane where the substrate 01 is located may not only include a vertical segment PVEE-y extending along the first direction Y as a whole, but also include a horizontal segment PVEE-x extending along the second direction X as a whole, so that the area occupied by the light-emitting panel 000 after plurality of second power signal lines PVEE are connected to each other may be relatively large, which may be beneficial for further reducing the voltage drop of the second power signal lines PVEE.

Optionally, the first power signal lines PVDD and the second power signal lines PVEE in one embodiment may respectively have a multi-layer wire structure. For example, the first power signal lines PVDD may be fabricated by using three wire layers in parallel including the source-drain metal layer, the capacitor metal layer, and the anode layer in the thin film transistor array layer; and the second power supply signal lines PVEE may be fabricated by using double wire layers in parallel including the source-drain metal layer and the capacitor metal layer in the thin film transistor array layer, which may be beneficial for further reducing the resistance of the power signal lines through the parallel structure and the voltage drop. In one embodiment, different filling patterns may be configured to only distinguish the first power signal lines PVDD and the second power signal lines PVEE, and different filling patterns may not be configured to indicate different layer arrangement of the first power signal lines PVDD and the second power signal lines PVEE. During an implementation, when all of the first power signal lines PVDD and the second power signal lines PVEE adopt a multi-layer wire structure, some structures may be disposed at a same layer, which may not be described in one embodiment.

It may be understood that, in one embodiment, the first power signal lines PVDD and the second power signal lines PVEE may all be fabricated with a planar conductive material, or a structure including the plurality of metal blocks connected to each other, which may only need to satisfy that the orthographic projection of the first power signal lines PVDD or the second power signal lines PVEE on the substrate 01 may form a meshed shape. Optionally, in one embodiment, a plurality of hollowed-out parts (not shown in drawings) may be formed in certain areas of the first power signal lines PVDD and the second power signal lines PVEE which have relatively large areas. Furthermore, the coupling capacitance may be reduced, and the coupling effect generated by the capacitance formed by overlapping large conductive structures on the drive of the pixel circuit 10 may be avoided, which may be beneficial for ensuring light-emitting quality.

Figure 28:
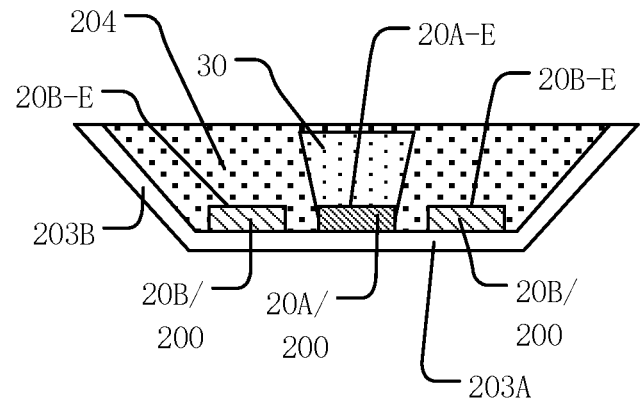
FIG. 28 illustrates another cross-sectional structural schematic of a light-emitting element according to various embodiments of the present disclosure.

In some optional embodiments, referring to FIGS. 1, 2 and 28, FIG. 28 illustrates another cross-sectional structural schematic of a light-emitting element according to various embodiments of the present disclosure. In one embodiment, the light-emitting element 20 may include a housing 203, and the plurality of light-emitting parts 200 of one light-emitting element 20 may be in the housing.

The housing 203 may include a bottom 203A and a side wall 203B; the side wall 203B may be configured to surround the light-emitting part 200; the plane of the bottom 203A may be in parallel with the plane of the substrate 01; the plane of the sidewall 203B may intersect the plane of the substrate 01; the light-emitting part 200 may be on the side of the bottom 203A away from the substrate 01; the housing 203 may be filled with a protective adhesive 204; the protective adhesive 204 may cover the plurality of light-emitting parts 200; and the collimation structure 30 may be embedded in the protective adhesive 204.

In one embodiment, it describes that the structure of the light-emitting element 20 may include the housing 203; the housing 203 may include the bottom 203A and the side wall 203B, which may be configured to form a carrier of the light-emitting part 2; the plurality of light-emitting parts 200 of one light-emitting element 20 may be in the housing 203; and the housing 203 may be configured to protect each light-emitting part 200 and other structures of the light-emitting element 20. The plane of the bottom 203A may be in parallel with the plane of the substrate 01, that is, the side of the bottom 203A away from the substrate 01 may be configured to dispose the light-emitting part 200. The plane of the sidewall 203B may intersect the plane of the substrate 01. Formed sidewall 203B may be configured to surround the light-emitting part 200, which may protect the light-emitting part 200 at the side. The housing 203 in one embodiment may be filled with the protective adhesive 204, and the protective adhesive 204 may cover the plurality of light-emitting parts 200. The protective adhesive 204 may stabilize the light-emitting part 200 in the housing 203 and also protect the light-emitting part 200 from being affected by external environment on its light-emitting effect. In one embodiment, when the collimation structure 30 is disposed on the side of the first light-emitting part 20A away from the substrate 01, the collimation structure 30 may be embedded in the protective adhesive 204. In such way, it satisfies that the collimation structure 30 may be at least partially overlapped with the first light-emitting part 20A and simultaneously stabilize the collimation structure 30.

Optionally, the protective adhesive 204 in one embodiment may be doped with fluorescent powder (not shown in drawings), that is, the protective adhesive 204 may be a fluorescent adhesive; and the fluorescent powder may be evenly distributed in the adhesive. The protective adhesive 204 doped with fluorescent powder may cover the blue light-emitting part 200. If the fluorescent adhesive contains a yellow phosphor, when the blue light-emitting unit 200 emits blue light, the yellow phosphor may be suitable for being excited by the blue light to emit yellow light. In one embodiment, the material of the fluorescent powder doped in the protective adhesive 204 may not be limited, which may be set according to actual light-emitting color requirement. Optionally, the protective adhesive 204 in one embodiment may be a transparent adhesive doped with fluorescent powder; and the transparent adhesive may be transparent silica adhesive. The transparent silica adhesive may have desirable thermal conductivity, which may not only provide desirable heat dissipation effect for each light-emitting part 200 of the light-emitting element 20, but also protect each light-emitting part 200 and reduce light loss.

In some optional embodiments, referring to FIGS. 1, 2 and 28, the light-emitting surface 20A-E of the first light-emitting part 20A and the light-emitting surface 20B-E of the second light-emitting part 20B may be in parallel with each other.

In one embodiment, it describes that when the light-emitting part 200 of the light-emitting element 20 is disposed in the housing 203, the light-emitting surface 20A-E of the first light-emitting part 20A and the light-emitting surface 20B-E of the second light-emitting part 20B may be configured to be in parallel with each other. That is, the light-emitting surface 20A-E of the first light-emitting part 20A and the light-emitting surface 20B-E of the second light-emitting part 20B may both face the side away from the substrate 01. As shown in FIG. 28, the light-emitting surface 20B-E of the second light-emitting part 20B may face upward, and the light-emitting panel 000 fabricated with the light-emitting element 20 may be directly used as the display panel.

Figure 29:
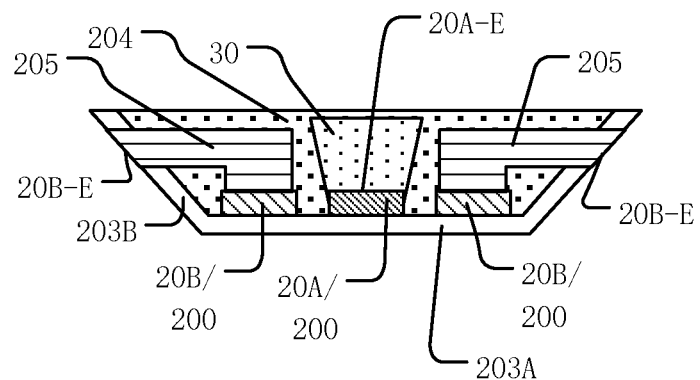
FIG. 29 illustrates another cross-sectional structural schematic of a light-emitting element according to various embodiments of the present disclosure.

Optionally, in other optional embodiments, referring to FIGS. 1, 2 and 29, FIG. 29 illustrates another cross-sectional structural schematic of a light-emitting element according to various embodiments of the present disclosure. In one embodiment, the light-emitting surface 20A-E of the first light-emitting part 20A and the light-emitting surface 20B-E of the second light-emitting part 20B may not be in parallel with each other. For example, the light-emitting surface 20A-E of the first light-emitting part 20A may intersect the light-emitting surface 20B-E of the second light-emitting part 20B. By embedding a light guiding structure 205 in the protective adhesive 204, the orthographic projection of the light guiding structure 205 on the substrate 01 may be at least partially overlapped with the orthographic projection of the second light-emitting part 20B on the substrate 01. That is, the light guiding structure 205 may be disposed at least directly above the second light-emitting part 20B. The light-emitting surface 20B-E of the second light-emitting part 20B may be drawn out from the position of the side wall 203B of the light-emitting element 20 through the L-shaped light guiding structure 205 shown in FIG. 29. That is, the side wall 203B of the housing 203 may have a hole at the position of the light guiding structure 205, which may be used as the light-emitting surface 20B-E of the second light-emitting part 20B. Furthermore, the light-emitting surface 20A-E of the first light-emitting part 20A may intersect the light-emitting surface 20B-E of the second light-emitting part 20B, and the light-emitting surface 20A-E of the first light-emitting part 20A may face directly upward in FIG. 29; and the light-emitting surface 20B-E of the second light-emitting part 20B may face two sides in FIG. 29. The light-emitting panel 000 fabricated with the light-emitting element 20 may be used as a backlight structure of the liquid crystal display apparatus, and the light-emitting element 20 emitting light from the side may be beneficial for improving the dark region between adjacent light-emitting elements 20 and improving light-emitting uniformity of the light-emitting panel 000 of entire backlight structure.

In some optional embodiments, referring to FIGS. 1, 2, 28, 29 and 30, FIG. 30 illustrates another structural schematic of a light-emitting element according to various embodiments of the present disclosure. In one embodiment, the light-emitting element 20 may include one cathode 201 and the plurality of anodes 202; and the cathode 201 and the anode 202 may be on the side of the housing 203 away from the light-emitting part 200.

In one embodiment, it describes that when the light-emitting element 20 itself includes at least two light-emitting parts 200, that is, the first light-emitting part 20A and the second light-emitting part 20B, and when the light-emitting element 20 is bound to the film layer structure on the substrate 10, for example, when the light-emitting element 20 is bound to the conductive soldering pad layer (not shown in drawings) on the substrate 01, the external of one light-emitting element 20 may include one cathode 201 and at least two anodes 202. The cathode 201 may be bound to a same cathode soldering pad on the conductive soldering pad layer, and the anode 202 may be bound to different anode soldering pads on the conductive soldering pad layer (not shown in drawings), thereby independently controlling different light-emitting parts 200 of a same light-emitting element 20. Therefore, the cathode 201 and the anode 202 of the light-emitting element 20 may be disposed on the side of the housing 203 away from the light-emitting part 200; the first electrode 2001 and the second electrode 2003 of the light-emitting part 200 inside the housing 203 may be electrically connected to each other by conductive metal wires; and through the cathode 201 and anode 202 outside the housing 203 which are bound to the film layer structure (conductive soldering pad) on the side of the substrate 01, electrical connection with the film layer structure (such as the pixel circuit 10) in the light-emitting panel 000 after binding may be realized, and the light-emitting element 20 may be driven to emit light.

Figure 30:
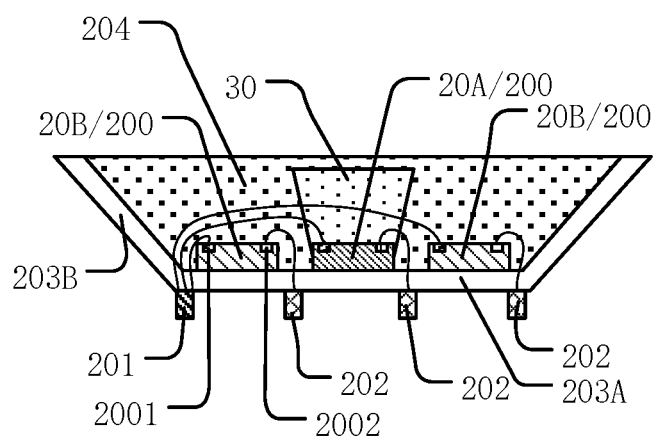
FIG. 30 illustrates another structural schematic of a light-emitting element according to various embodiments of the present disclosure.

It may be understood that, in one embodiment, FIG. 30 only exemplarily illustrates the connection manner that the cathode 201 of the light-emitting element 20 is electrically connected to the first electrode 2001 of the light-emitting part 200, and the anode 202 is electrically connected to the second electrode 2002 of the light-emitting part 200 through conductive metal wires. During an implementation, the connection manner of the conductive metal wires may include, but may not be limited to, above-mentioned manner, and may also be other connection structures. In an implementation, the conductive metal wires used for connection may be disposed at other positions of the light-emitting element 20 away from the light-emitting surface and the like as required, which may only need to satisfy that the first electrode 2001 of the light-emitting part 200 may be electrically connected to corresponding cathode 201 through the conductive metal wires, and the second electrode 2002 of the light-emitting part 200 may be electrically connected to corresponding anode 202 through the conductive metal wires, which may not be described in detail in one embodiment.

Figure 31:
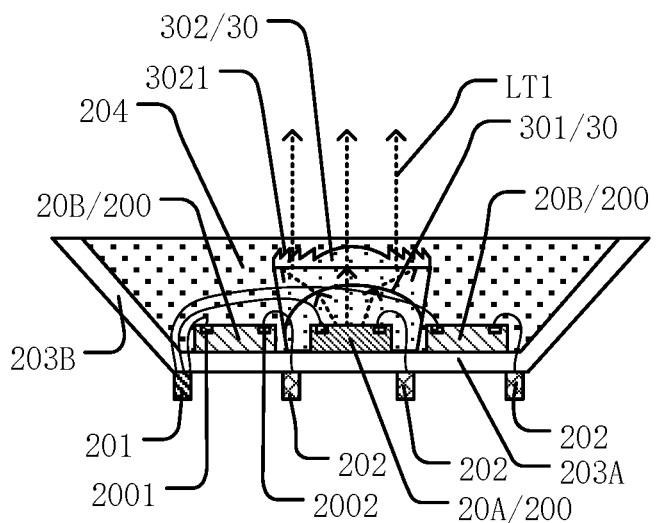
FIG. 31 illustrates another structural schematic of a light-emitting element according to various embodiments of the present disclosure.

In some optional embodiments, referring to FIGS. 1, 2 and 31, FIG. 31 illustrates another structural schematic of a light-emitting element according to various embodiments of the present disclosure. In one embodiment, the collimation structure 30 may include a concave lens 301 on the side of the first light-emitting part 20A away from the substrate 01, and a Fresnel lens 302 on the side of the concave lens 301 away from the substrate 01.

In one embodiment, it describes that the collimation structure 30, which may be configured to collimate and gather the light emitted by the first light-emitting part 20A to ensure that outgoing light of the first light-emitting part 20A after passing through the collimation structure 30 is collimated light, may include the concave lens 301 and the Fresnel lens 302. The concave lens 301 may be disposed on the side of the first light-emitting part 20A away from the substrate 01, and the Fresnel lens 302 may be disposed on the side of the concave lens 301 away from the substrate 01. The light emitted from the first light-emitting part 20A may be deflected and diverged after passing through the concave lens 301. For the light perpendicular to the plane where the substrate 01 is located, no deflection may occur after passing through the concave lens 301. However, the light with a certain angle to the positive viewing angle light (the light perpendicular to the plane where the substrate 01 is located) may be deflected and diverged after entering the concave lens 301. The Fresnel lens 302 may be a threaded lens. Optionally, the Fresnel lens 302 may be a thin sheet made of polyolefin material. The surface of the Fresnel lens 302 away from the substrate 01 may include a series of grooves 3021, and the central part may be an elliptical arc. The angle between each groove 3021 and its adjacent groove 3021 may be different, but each groove 3021 may converge the light in a position to form a central focus. Each groove 3021 may be regarded as an independent small lens. Such structure may adjust the light into parallel light, so that the light emitted from the first light-emitting part 20A may be diverged by the action of the concave lens 301, and then may be adjusted into parallel light after passing through the Fresnel lens 302, that is, the collimated light LT1 with a positive viewing angle (the light path shown in FIG. 31). Furthermore, in the first light-emitting mode of anti-peep, only the first light-emitting part 20A may emit light, and emitted light may be the collimated light with a narrow viewing angle, thereby realizing light-emitting effect of a narrow viewing angle.

It may be understood that, in one embodiment, FIG. 31 only exemplarily illustrates the connection manner that the cathode 201 of the light-emitting element 20 is electrically connected to the first electrode 2001 of the light-emitting part 200, and the anode 202 is electrically connected to the second electrode 2002 of the light-emitting part 200 through conductive metal wires. During an implementation, the connection manner of the conductive metal wires may include, but may not be limited to, above-mentioned manner, and may also be other connection structures. In an implementation, the conductive metal wires used for connection may be disposed at other positions of the light-emitting element 20 away from the light-emitting surface and the like as required, which may only need to satisfy that the first electrode 2001 of the light-emitting part 200 may be electrically connected to corresponding cathode 201 through the conductive metal wires, and the second electrode 2002 of the light-emitting part 200 may be electrically connected to corresponding anode 202 through the conductive metal wires, which may not be described in detail in one embodiment.

Figure 32:
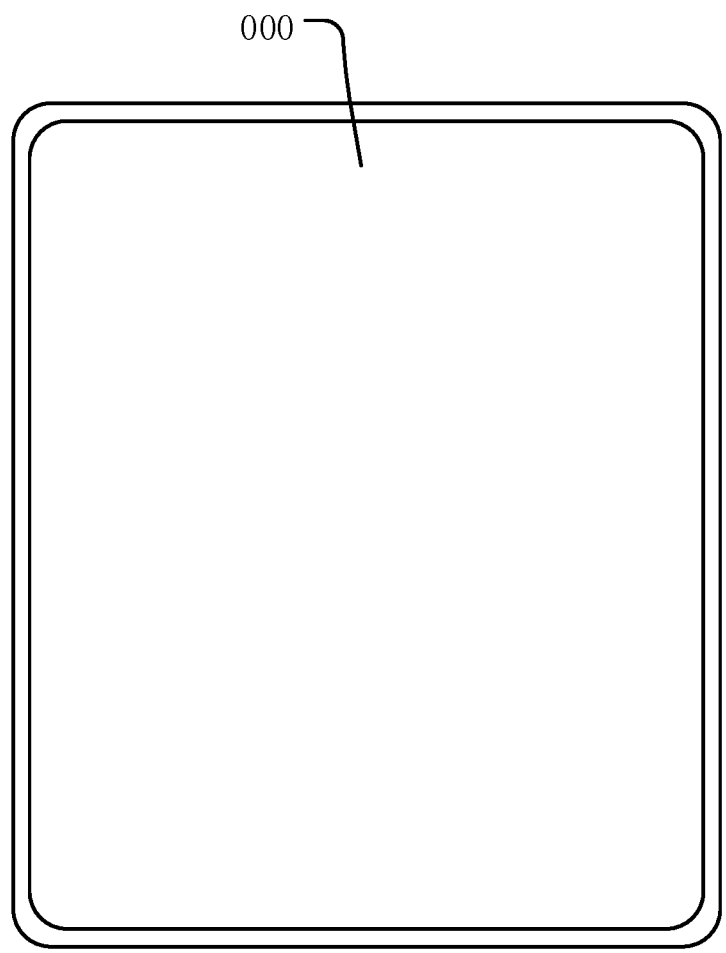
FIG. 32 illustrates a planar structural schematic of a display apparatus according to various embodiments of the present disclosure.

In some optional embodiments, referring to FIG. 32, FIG. 32 illustrates a planar structural schematic of a display apparatus according to various embodiments of the present disclosure. The display apparatus 111 provided in one embodiment may include the light-emitting panel 000 provided in above-mentioned embodiments of the present disclosure. Optionally, the display apparatus 111 may be the light-emitting panel 000 in above-mentioned embodiments of the present disclosure for direct display. Or the display apparatus 111 may also be a liquid crystal display apparatus. At this point, the light-emitting panel 000 in one embodiment may be used as a direct-lit backlight. In one embodiment, the type of the display apparatus 111 may not be limited and may be configured according to actual requirements during an implementation. In one embodiment, the mobile phone may be taken as an example to illustrate the display apparatus 111 in FIG. 32. It may be understood that the display apparatus 111 provided in embodiments of the present disclosure may be a display apparatus 111 with a display function, such as a computer, a television, or a vehicle-mounted display apparatus, which may not be limited in the present disclosure. The display apparatus 111 provided by embodiments of the present disclosure may have the beneficial effect of the light-emitting panel 000 provided by embodiments of the present disclosure. Details may refer to descriptions of the light-emitting panel 000 in above-mentioned embodiments, which may not be described in detail here in one embodiment.

From above-mentioned embodiments, it may be seen that the light-emitting panel and the display apparatus provided by the present disclosure may achieve at least following beneficial effects.

The light-emitting panel provided by the present disclosure may include the plurality of light-emitting units; the light-emitting units may be understood as the plurality of light-emitting pixel regions by dividing the light-emitting panel; the pixel circuits and light-emitting elements included in the light-emitting panel may be disposed on the substrate; the substrate may be used as the carrier substrate of the light-emitting panel; and the pixel circuit may be a drive circuit that provides a drive current for the light-emitting element, and the light-emitting element may emit light under the drive of the pixel circuit. One light-emitting element may include the plurality of independent light-emitting parts, the plurality of light-emitting parts in one light-emitting element may be all electrically connected to the pixel circuit, whether different light-emitting parts in the light-emitting element emit light may be controlled through the pixel circuit. The side of the first light-emitting part away from the substrate may include the collimation structure, and the orthographic projection of the collimation structure on the substrate may be overlapped with the orthographic projection of the first light-emitting part on the substrate. The collimation structure may include the lens or the like that collimates and gathers the light emitted by the first light-emitting part, thereby ensuring that the emitted light of the first light-emitting part after passing through the collimation structure is the collimated light. The light-emitting panel may include the first light-emitting mode and the second light-emitting mode. In the first light-emitting mode, the pixel circuit may only control the first light-emitting part of the light-emitting element electrically connected to the pixel circuit to emit light. Since the collimation structure is disposed on the side of the first light-emitting part away from the substrate, the light emitted from the first light-emitting part may be collimated after passing through the collimation structure, that is, the light-emitting range of a narrow viewing angle, thereby realizing the first light-emitting mode of the light-emitting panel with a narrow viewing angle. In the second light-emitting mode, the pixel circuit may at least control the second light-emitting part of the light-emitting element electrically connected to the pixel circuit to emit light. That is, in the light-emitting unit at this point, the pixel circuit may need to drive and control at least the second light-emitting part of the light-emitting element to emit light. Since the side of the second light-emitting part away from the substrate is not disposed with any structure that changes the light-emitting path, the light emitted by the second light-emitting part may freely exit according to its own performance, and the light finally emitted from the light-emitting surface of the light-emitting panel may be divergent large-angle light, that is, the light-emitting range of a wide viewing angle, thereby realizing the second light-emitting mode of the light-emitting panel with a wide viewing angle. In the present disclosure, the light-emitting element with simple structure may include the plurality of light-emitting parts; the collimation structure may be disposed above one of the light-emitting parts, that is, the first light-emitting part; the light-emitting panel may be freely switched between a wide viewing angle and a narrow viewing angle through the control of the pixel circuit; and the design of complicated viewing angle switching structure such as the light guiding plate, the light bar, and the double liquid crystal box in the existing technology may be cancelled, which may be beneficial for reducing panel thickness. In such way, the display panel may not only have simple structure and low cost, but also realize the switch between wide and narrow viewing angles without complicated drive control circuits and have low power consumption; and the light-emitting effects in both wide viewing angle and narrow viewing angle modes may be effectively ensured.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A light-emitting panel, comprising:
a plurality of light-emitting units, wherein a light-emitting unit of the plurality of light-emitting units includes a pixel circuit and a light-emitting element which are electrically connected to each other; the light-emitting element includes a plurality of light-emitting parts; and a plurality of light-emitting parts in one light-emitting element includes a first light-emitting part and a second light-emitting part; and
a substrate, wherein the pixel circuit and the light-emitting element are disposed on the substrate; a collimation structure is on a side of the first light-emitting part away from the substrate; and an orthographic projection of the collimation structure on the substrate is overlapped with an orthographic projection of the first light-emitting part on the substrate; wherein:
the light-emitting panel includes a first light-emitting mode and a second light-emitting mode;
in the first light-emitting mode, the pixel circuit only controls the first light-emitting part of the light-emitting element electrically connected to the pixel circuit to emit light;
in the second light-emitting mode, the pixel circuit at least controls the second light-emitting part of the light-emitting element electrically connected the pixel circuit to emit light;
the light-emitting element includes a cathode and at least two anodes;
each light-emitting part includes a first electrode and a second electrode; and
in the one light-emitting element, first electrodes of the plurality of light-emitting parts are all connected to a same cathode, a second electrode of the first light-emitting part is connected to one anode, and a second electrode of the second light-emitting part is connected to another anode.

2. The light-emitting panel according to claim 1, wherein:
in the second light-emitting mode, the pixel circuit also controls the first light-emitting part of the light-emitting element electrically connected to the pixel circuit to emit light.

3. The light-emitting panel according to claim 1, wherein:
in the one light-emitting element, anodes corresponding to second light-emitting parts are connected to each other through a first connection wire.

4. The light-emitting panel according to claim 1, wherein:
the plurality of light-emitting parts in the one light-emitting element includes one first light-emitting part and at least two second light-emitting parts; and
in the one light-emitting element, a second electrode of the one first light-emitting part is connected to one anode, and second electrodes of the at least two second light-emitting parts share one anode.

5. The light-emitting panel according to claim 1, wherein:
the one light-emitting element includes two anodes which are a first anode and a second anode respectively; the first anode is connected to the second electrode of the first light-emitting part; and the second anode is connected to the second electrode of the second light-emitting part.

6. The light-emitting panel according to claim 5, wherein:
along a direction perpendicular to a plane of the substrate, an orthographic projection of the cathode is configured to surround an orthographic projection of the first anode; and an orthographic projection of the second anode is configured to surround the orthographic projection of the cathode; and
a shape of the orthographic projection of the first anode on the substrate is a block, a shape of the orthographic projection of the cathode on the substrate is a ring, and a shape of the orthographic projection of the second anode on the substrate is a ring.

7. The light-emitting panel according to claim 1, further including:
a conductive soldering pad layer on a side of the substrate, wherein:
the conductive soldering pad layer includes a plurality of first soldering pad groups and a plurality of second soldering pad groups; the first soldering pad group includes a first soldering pad and a second soldering pad; and the second soldering pad group includes a third soldering pad and a fourth soldering pad; and
in the one light-emitting element, the cathode is bound to the first soldering pad and the third soldering pad respectively; the one anode connected to the first light-emitting part is bound to the second soldering pad; and the another anode connected to the second light-emitting part is bound to the fourth soldering pad.

8. The light-emitting panel according to claim 1, wherein:
the pixel circuit at least includes a first control transistor and a second control transistor which are electrically connected to a same light-emitting element; and
the first control transistor is electrically connected to the first light-emitting part of the one light-emitting element, and the second control transistor is electrically connected to the second light-emitting part of the one light-emitting element.

9. The light-emitting panel according to claim 8, wherein:
in the first light-emitting mode, the first control transistor is in conduction, and the second control transistor is in cutoff; and in the second light-emitting mode, the first control transistor is in cutoff, and the second control transistor is in conduction.

10. The light-emitting panel according to claim 8, wherein:
in the first light-emitting mode, the first control transistor is in conduction, and the second control transistor is in cutoff; and in the second light-emitting mode, the first control transistor is in conduction, and the second control transistor is in conduction; and/or
working stages of the pixel circuit at least include a reset stage, a threshold compensation and data write stage, and a light-emitting stage; in the first light-emitting mode, at the light-emitting stage of the pixel circuit, the first control transistor is in conduction; and the first control transistor is in cutoff at other working stages of the pixel circuit; and in the second light-emitting mode, at the light-emitting stage of the pixel circuit, the first control transistor is in conduction, and the second control transistor is in conduction; and at other working stages of the pixel circuit, the first control transistor is in cutoff, and the second control transistor is in cutoff.

11. The light-emitting panel according to claim 8, wherein:
a gate electrode of the first control transistor is connected to a first control signal line, and a first electrode of the first control transistor is electrically connected to the first light-emitting part; and
a gate electrode of the second control transistor is connected to a second control signal line, and a first electrode of the second control transistor is electrically connected to the second light-emitting part.

12. The light-emitting panel according to claim 11, wherein:
the pixel circuit includes a first reset module, a second reset module, a drive transistor, a threshold compensation module, a data write module, a first light-emitting control module and a second light-emitting control module;
a control terminal of the first reset module is connected to a first scan signal line; a first terminal of the first reset module is connected to a reference voltage signal line; and a second terminal of the first reset module is connected to a gate electrode of the drive transistor;
a control terminal of the second reset module is connected to the first scan signal line, a first terminal of the second reset module is connected to the reference voltage signal line, a second terminal of the second reset module is connected to a second electrode of the first control transistor and a second electrode of the second control transistor;
a control terminal of the data write module is connected to a second scan signal line, a first terminal of the data write module is connected to a data line, and a second terminal of the data write module is connected to a first electrode of the drive transistor;
a control terminal of the threshold compensation module is connected to the second scan signal line, a first terminal of the threshold compensation module is connected to the gate electrode of the drive transistor, and a second terminal of the threshold compensation module is connected to a second electrode of the drive transistor;
a control terminal of the first light-emitting control module is connected to a light-emitting control signal line, a first terminal of the first light-emitting control module is connected to a first power signal line, and a second terminal of the first lighting control module is connected to the first electrode of the drive transistor;
a control terminal of the second light-emitting control module is connected to the light-emitting control signal line, a first terminal of the second light-emitting control module is connected to the second electrode of the drive transistor, and a second terminal of the second lighting control module is connected to a second power signal line;
extension directions of the first control signal line, the second control signal line, the first scan signal line and the second scan signal line are same;
in the one light-emitting unit, an orthographic projection of the light-emitting element on the substrate and an orthographic projection of the pixel circuit on the substrate are respectively arranged along a first direction; and along a second direction, an orthographic projection of the first power signal line on the substrate and an orthographic projection of the second power signal line on the substrate are respectively on two opposite sides of the light-emitting element, wherein the second direction is same as an extension direction of the first scan signal line, and the first direction intersects the second direction; and/or
a plurality of first power signal lines is connected to each other, and an orthographic projection of the plurality of first power signal lines on a plane of the substrate includes a mesh structure; and a plurality of second power signal lines is connected to each other, and an orthographic projection of the plurality of second power signal lines on the plane of the substrate includes a mesh structure.

13. The light-emitting panel according to claim 12, wherein:
the pixel circuit includes a plurality of transistors, wherein the first light-emitting control module includes a first transistor, and the second light-emitting control module includes a second transistor; and a width-to-length ratio of each of the first transistor, the second transistor and the drive transistor is greater than a width-to-length ratio of each of other transistors in the pixel circuit.

14. The light-emitting panel according to claim 1, wherein:
the light-emitting element includes a housing; and the plurality of light-emitting parts of the one light-emitting element is in the housing;
the housing includes a bottom and a side wall; the side wall is configured to surround the plurality of light-emitting parts; a plane of the bottom is in parallel with a plane of the substrate; a plane of the sidewall intersects the plane of the substrate; the plurality of light-emitting parts is on a side of the bottom away from the substrate; the housing is filled with a protective adhesive; and the protective adhesive covers the plurality of light-emitting parts;

the collimation structure is embedded in the protective adhesive;

the protective adhesive is doped with fluorescent powder; and/or the light-emitting element includes a cathode and a plurality of anodes; and the cathode and the plurality of anodes are on a side of the housing away from the light-emitting part.

15. The light-emitting panel according to claim 14, wherein:
a light-emitting surface of the first light-emitting part is in parallel with a light-emitting surface of the second light-emitting part.

16. The light-emitting panel according to claim 14, wherein:
a light guiding structure is embedded in the protective adhesive; and an orthographic projection of the light guiding structure on the substrate is at least partially overlapped with an orthographic projection of the second light-emitting part on the substrate; and
a light-emitting surface of the first light-emitting part intersects a light-emitting surface of the second light-emitting part.

17. The light-emitting panel according to claim 1, wherein:
the light emitting element includes one of a micro-light-emitting diode or a sub-millimeter light-emitting diode.

18. A light-emitting panel, comprising:
a plurality of light-emitting units, wherein a light-emitting unit of the plurality of light-emitting units includes a pixel circuit and a light-emitting element which are electrically connected to each other; the light-emitting element includes a plurality of light-emitting parts; and a plurality of light-emitting parts in one light-emitting element includes a first light-emitting part and a second light-emitting part; and
a substrate, wherein the pixel circuit and the light-emitting element are disposed on the substrate; a collimation structure is on a side of the first light-emitting part away from the substrate; and an orthographic projection of the collimation structure on the substrate is overlapped with an orthographic projection of the first light-emitting part on the substrate; wherein:
the light-emitting panel includes a first light-emitting mode and a second light-emitting mode;
in the first light-emitting mode, the pixel circuit only controls the first light-emitting part of the light-emitting element electrically connected to the pixel circuit to emit light;
in the second light-emitting mode, the pixel circuit at least controls the second light-emitting part of the light-emitting element electrically connected the pixel circuit to emit light; and
the collimation structure includes a concave lens on the side of the first light-emitting part away from the substrate, and a Fresnel lens on a side of the concave lens away from the substrate.

19. A display apparatus, comprising:
a light-emitting panel, comprising:
a plurality of light-emitting units, wherein a light-emitting unit of the plurality of light-emitting units includes a pixel circuit and a light-emitting element which are electrically connected to each other; the light-emitting element includes a plurality of light-emitting parts; and a plurality of light-emitting parts in one light-emitting element includes a first light-emitting part and a second light-emitting part; and
a substrate, wherein the pixel circuit and the light-emitting element are disposed on the substrate; a collimation structure is on a side of the first light-emitting part away from the substrate; and an orthographic projection of the collimation structure on the substrate is overlapped with an orthographic projection of the first light-emitting part on the substrate; wherein:
the light-emitting panel includes a first light-emitting mode and a second light-emitting mode;
in the first light-emitting mode, the pixel circuit only controls the first light-emitting part of the light-emitting element electrically connected to the pixel circuit to emit light;
in the second light-emitting mode, the pixel circuit at least controls the second light-emitting part of the light-emitting element electrically connected the pixel circuit to emit light;
the light-emitting element includes a cathode and at least two anodes;
each light-emitting part includes a first electrode and a second electrode; and
in the one light-emitting element, first electrodes of the plurality of light-emitting parts are all connected to a same cathode, a second electrode of the first light-emitting part is connected to one anode, and a second electrode of the second light-emitting part is connected to another anode.

* * * * *